(12) United States Patent
Inoue

(10) Patent No.: US 6,731,526 B2
(45) Date of Patent: May 4, 2004

(54) CAM CELL ARRAY, TCAM CELL, TCAM CELL ARRAY, ADDRESS SEARCH MEMORY, AND NETWORK ADDRESS SEARCH APPARATUS

(75) Inventor: Kazunari Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/374,103

(22) Filed: Feb. 27, 2003

(65) Prior Publication Data

US 2003/0179623 A1 Sep. 25, 2003

(30) Foreign Application Priority Data

Mar. 20, 2002 (JP) ........................................ 2002-079457

(51) Int. Cl.[7] .............................................. G11C 15/00
(52) U.S. Cl. ..................... 365/49; 365/168; 365/189.06
(58) Field of Search ..................... 365/49, 154, 189.06, 365/189.07, 168; 711/108

(56) References Cited

U.S. PATENT DOCUMENTS 4,965,767 A * 10/1990 Kinoshita et al. ............. 365/49
6,320,777 B1    11/2001 Lines et al.
6,388,909 B2 *  5/2002 Takahashi et al. ............. 365/49
6,480,406 B1 * 11/2002 Jin et al. ....................... 365/49
6,504,741 B2 *  1/2003 Ema ............................. 365/49

FOREIGN PATENT DOCUMENTS

| JP | 4-262436 | 9/1992 |
| JP | 6-333395 | 12/1994 |
| JP | 10-21690 | 1/1998 |
| JP | 10-503317 | 3/1998 |

OTHER PUBLICATIONS

Pankaj Gupta et al., "Algorithms for Packet Classificaiton," IEEE Network, Mar./Apr. 2001, pp. 24–32.
Sundar Iyer et al., "ClassIPL: An Architecture for Fast and Flexible Packet Classification," IEEE Network, Mar./Apr. 2001, p. 33.

* cited by examiner

Primary Examiner—Gene Auduong
(74) Attorney, Agent, or Firm—Burns, Doane, Swecker & Mathis, LLP

(57) ABSTRACT

A content addressable memory (CAM) cell array includes a first-stage memory cell array and a second-stage memory cell array. Only when data on search output lines (match lines) connected to the first-stage memory cell array are coincident, the second-stage memory cell array performs search operation. Therefore, power consumption of the CAM cell array can be reduced.

7 Claims, 20 Drawing Sheets

CAM CELL ARRAY, TCAM CELL, TCAM CELL ARRAY, ADDRESS SEARCH MEMORY, AND NETWORK ADDRESS SEARCH APPARATUS

FIELD OF THE INVENTION

The present invention relates to a technology for searching a network address in a so-called pipeline system.

BACKGROUND OF THE INVENTION

As Internet users and construction of local area networks (LANs) in enterprises increase in recent years, ternary content addressable memories (TCAMs) serving as address search apparatuses are used frequently in routers at relay points on a network in order to enhance the processing capability. Hereafter, the TCAM will be explained by referring to FIGS. 15 to 20. FIG. 15 is a diagram which shows a configuration example of a network system in which the TCAM serving as the address search apparatus is used. FIG. 16 is a diagram which shows a classifying algorithm of packets using hardware processing. FIG. 17 is a concept diagram which shows a basic configuration and search operation of the TCAM. FIG. 18 is a block diagram which shows a detailed configuration of the TCAM. FIG. 19 is a concept diagram which shows a configuration of a conventional TCAM cell shown in FIG. 18.

FIG. 15 shows a system example shown in "Algorithms for Packet Classification" IEEE Network, March/April 2001. In FIG. 15, a network 1601 is administered by an Internet service provider (ISP1). An intra-enterprise network (E1) 1603 is connected to the network 1601 via a router at a relay point ("junction router") 1602. An intra-enterprise network (E2) 1605 is connected to the network 1601 via a junction router 1604.

In addition, a network access point (NAP) 1607 is connected to the network 1601 via a junction router 1606. A network 1608 administered by an Internet service provider (ISP2) and a network 1609 administered by an Internet service provider (ISP3) are connected to the NAP 1607.

In the junction routers 1602, 1604 and 1606 in the configuration heretofore explained, a rule stated in a header of a received packet is looked up, and packet classification is conducted. For example, in the junction router 1606, packets received from the NAP 1607 are classified, such as "this packet should go to the intra-enterprise network E1", "this packet should not go to the intra-enterprise network E1, but hop to the intra-enterprise network E2", and "this packet should not go anywhere".

In headers of packets, such various kinds of information are stated in the form of rules, and they serve as search keys for classification in junction routers. In each junction router, it is necessary to look up what action each of all rules included in various received packets requires and to instantaneously determine to which routers the respective packets should be delivered (hopped).

There are various techniques for the packet classification ("Algorithms for Packet Classification" IEEE Network, March/April 2001). Today, a packet classification algorithm using hardware processing as shown in FIG. 16 is used most frequently. In this algorithm, special hardware called ternary content addressable memory (TCAM) is used.

With reference to FIG. 16, in the packet classification algorithm using hardware processing, a TCAM 1701, a priority encoder 1702, and an action memory 1703 are used.

In the TCAM 1701, a rule is held every entry. Since TCAM in these days is too expensive, only a rule name, i.e., only a label is typically held in each entry. An action to be subsequently executed is stored in the action memory 1703 formed of comparatively inexpensive DRAMs or SRAMs.

If a rule as a destination address is given to an input pin of the TCAM 1701 from the packet, parallel coincidence comparison is started all at once between the rule given to the input pin and internally held rules. And an entry number (or entry numbers) bearing coincidence or a highest resemblance is output. For example, if a rule (R4, R5 and R6) is given, an entry number #3 is output.

When there are plurality of search results of the TCAM 1701, the priority encoder 1702 supplies an entry having a lowest number to the action memory 1703 as an entry having high priority. With respect to the entry input from the priority encoder 1702, the action memory 1703 searches out an action to be subsequently conducted. As a result, the next router is specified and a packet is transferred. Hopping to the next step is thus conducted.

For example, if a rule is an IP address, an "X" value (don't care) is often used. This means that it is removed from search targets of coincidence comparison. If a stored value is "X", the TCAM 1701 determines it to be unconditional coincidence. Therefore, information to be stored by an internal cell of the TCAM 1701 also becomes ternary, "0", "1" and "X". The name of ternary CAM (content addressable memory) comes from this.

A basic hardware configuration of the TCAM and basic operation of the search will now be explained by referring to FIG. 17. In FIG. 17, a search port 1801 is provided in the TCAM. In the search port 1801, a data sequence of a search command is disposed. A plurality of TCAM cells 1802 are provided in each of entries (entries #0 to #n). The plurality of TCAM cells 1802 are connected to the data sequence of the search port 1801 by search operation bit lines (search lines) 1803 in one-to-one correspondence. The plurality of TCAM cells 1802 provided for each of entries (entries #0 to #n) are connected in common to a search output line (match line) 1804. Each of the TCAM cells 1802 stores a ternary value of "0", "1", or "X".

If the search command is supplied to an input pin, not shown, at the time of search operation, then the search command is transferred to the search port 1801, and the data sequence of the search command is disposed on the search operation bit lines 1803 and transferred to all TCAM cells 1802 of each entry. As a result, comparison is simultaneously started in all entries to determine whether the data sequence coincides with data held in the TCAM cells 1802.

The search output line 1804 is precharged to a high ("H") level before the search operation is started. Typically, on a search output line 1804 connected to coincident TCAM cells 1802, the "H" level is held as it is. On the other hand, on a search output line 1804 connected to a non-coincident TCAM cell 1802, discharge is conducted via a transistor in the cell and the search output line 1804 is lowered to a low ("L") level. In other words, the TCAM 1701 serving as an address search apparatus shown in FIG. 16 checks the entry number of the search output line 1804 that holds the "H" level and outputs the entry number to the priority encoder 1702. This is the role of the TCAM 1701.

A detailed configuration of the TCAM and outline of its search operation will be explained with reference to FIG. 18. As shown in FIG. 18, the TCAM includes a data input/output pin 1901, a command control pin 1902, an address input pin 1903, and a search result output pin 1904 as pins for connection to the outside.

A command decoder 1921 is connected to the command control pin 1902. A command supplied to the command control pin 1902 is decoded by the command decoder 1921. An operation command resulting from the decoding is sent to each section.

A decoder 1931 is connected to the address input pin 1903. A row decoder 1932 is connected to an output terminal of the decoder 1931. An output terminal of a search encoder 1941 is connected to the search result output pin 1904.

Between an output terminal of each row of the row decoder 1932 and an input terminal of a corresponding row of the search encoder 1941, a plurality of TCAM cells 1910 are arranged so as to form one lateral line. A mask data word line 1933 and a valid data word line 1943 are connected to the output terminal of each row of the row decoder 1932. A plurality of TCAM cells arranged in one lateral line are connected to the mask data word line 1933 and the valid data word line 1943 in parallel.

A search output line (match line) 1942 is connected to the input terminal of each row of the search encoder 1941. A plurality of TCAM cells 1910 arranged in one lateral line are connected to each search output line 1942 in parallel.

A plurality of sense amplifiers 1911 and a plurality of search drivers 1912 and 1913 are connected to the data input/output pin 1901. The plurality of sense amplifiers 1911 and the plurality of search drivers 1912 and 1913 are connected on one terminal side of each column of a plurality of TCAM cells 1910 arranged in one lateral line in one-to-one correspondence.

Bit lines 1914 and 1915 for a write operation, a read operation and a refresh operation are provided for each of the sense amplifiers 1911. A plurality of TCAM cells 1910 in each column of the plurality of TCAM cells 1910 arranged in one lateral line are connected to the two bit lines 1914 and 1915 in parallel.

Search operation bit lines (search lines) 1916 and 1917 are connected to a plurality of search drivers 1912 and 1913, respectively. The plurality of TCAM cells 1910 in each column of the plurality of TCAM cells 1910 arranged in one lateral line are connected to the two search operation bit lines 1916 and 1917 in parallel.

When writing data in the TCAM cells 1910 in the configuration heretofore explained, a write command is supplied to the command control pin 1902. Data to be written is supplied to the data input/output pin 1901. An address and an entry number in which the data should be written are supplied to the address input pin 1903.

With respect to the write command, the address input is not needed so much. What is finally needed is the next action corresponding to each rule (input data). Therefore, rather than whether data is input to the TCAM entry, it is necessary to administer only the entry of the TCAM and lookup of the next action memory. Therefore, data may be input to empty entries in order. In order to look up the entry in which the data has been written, address information can be output to the search result output pin 1904 at the time of data writing.

Write data is transferred to the two bit lines 1914 and 1915 by a write buffer circuit incorporated in the sense amplifier 1911. At the same time, the write address is input to the row decoder 1932 via the decoder 1931, and the data is written into TCAM cells 1910 in the desired entry.

A search operation will also be explained below. A search command is supplied to the command control pin 1902, and a data sequence to be searched is also supplied to the data input/output pin 1901. At the time of search, the data sequence is transferred to the search operation bit lines 1916 and 1917 via the search drivers 1912 and 1913. At this time, the search output line 1942 is previously precharged to the "H" level before the search operation is started.

In the TCAM cells 1910, comparison is made whether the held data and the search operation bit lines 1916 and 1917 are coincident. A search output line 1942 connected to only an entry in which the whole data sequence has coincided holds the "H" level. If there is non-coincidence even in one bit, the entry connected to the search output line 1942 lowers the level of the search output line 1942 to the "L" level by discharge through a transistor in the cell. This is conducted by wired-OR processing.

In the search encoder 1941, a search output line 1942 on which the whole data sequence coincides and holds the "H" level is found out. The number of the entry to which the search output line 1942 that holds the "H" level belongs is output from the search result output pin 1904.

Each of the conventional TCAM cells 1910 shown in FIG. 18 has, for example, a configuration as shown in FIG. 19. In FIG. 19, the conventional TCAM cell 1910 is formed so as to hold a ternary value of "1", "0" or "X" by a combination of two physical cells, a valid data storage cell 2001 and a mask data storage cell 2002.

Each of the valid data storage cell 2001 and the mask data storage cell 2002 has two inverters connected in an anti-parallel form so as to form a flip-flop.

A first storage terminal of the valid data storage cell 2001 is connected to a MOS transistor 2011 at its source electrode, and connected to a MOS transistor 2012 at its gate electrode. A second storage terminal is connected to a MOS transistor 2013 at its source electrode, and connected to a MOS transistor 2014 at its gate electrode. The MOS transistor 2011 is connected at its drain electrode to a bit line 2015. The MOS transistor 2013 is connected at its drain electrode to a bit line 2016. Gate electrodes of the MOS transistors 2011 and 2013 are connected in common to a valid data word line 2017. The MOS transistors 2012 and 2014 are connected in series. One terminal of the series connection is connected to a search operation bit line 2018, and the other terminal is connected to a search operation bit line 2019.

A first storage terminal of the mask data storage cell 2002 is connected to a MOS transistor 2021 at its source electrode. A second storage terminal is connected to a MOS transistor 2022 at its source electrode, and connected to a MOS transistor 2023 at its gate electrode. The MOS transistor 2021 is connected at its drain electrode to a bit line 2024. The MOS transistor 2022 is connected at its drain electrode to a bit line 2025. Gate electrodes of the MOS transistors 2021 and 2022 are connected in common to a mask data word line 2026. The MOS transistors 2023 is connected at its source electrode to ground, and connected at its drain electrode to a MOS transistor 2027 at its source electrode. The MOS transistor 2027 is connected at its gate electrode to a connection terminal between the MOS transistors 2012 and 2014 connected in series. The MOS transistor 2027 is connected at its drain electrode to a search output line 2030.

In the TCAM cell used in the conventional network address search apparatus (LSI), two physical cells, i.e., a SRAM (static random access memory) cell and a search (coincidence comparison) cell are thus formed by using, for example, 16 MOS transistors as shown in FIG. 19 in order to represent a ternary value of "1", "0", and "X".

A search operation in the TCAM cell is represented by the following expression.

If ([val=1'b0]&&[mas=1'b1]) then WORD<=1'b0

If ([val=1'b1]&&[mas=1'b1]) then WORD<=1'b1

If ([val=1'bx]&&[mas=1'b0]) then WORD<=1'bx

In other words, if a mask bit held in the mask data storage cell 2002 is "1", then it is determined whether a valid bit held in the valid data storage cell 2001 coincides with the search operation bit lines 2018 and 2019, and a search result is output to the search output line 2030. When the mask bit held in the mask data storage cell 2002 is "0", then the MOS transistors 2023 and 2027 do not turn on and consequently the search output line 2030 is never connected to the ground level (GND).

However, the conventional TCAM cell has the following problems. First, in the conventional TCAM cell, two physical cells, i.e., the SRAM cell and the search (coincidence comparison) cell are formed by using, for example, 16 MOS transistors as shown in FIG. 19. This results in a problem that the area occupied by each cell is large and consequently TCAM cells of a large capacity cannot be mounted on LSI silicon. It is the actual state that only a capacity of 9 Mbits at most can be ensured. This is evident by comparison with today's SRAM formed of six MOS transistors and today's dynamic random access memory (DRAM) formed of one MOS transistor and one capacitor.

FIG. 20 shows the search operation to facilitate understanding. A TCAM cell array 2101 shown in FIG. 20 is formed of the whole number of rows each in which a plurality TCAM cells 1910 are arranged in one lateral line as shown in FIG. 18. A search driver 2102 is a collective representation of the search drivers 1912 and 1913 shown in FIG. 18. In the search driver 2102, there is provided a search line SL serving as a search operation bit line in each column including a plurality of TCAM cells. A match line ML serving as a search output line is provided in each row including a plurality of TCAM cells arranged in one lateral line.

With reference to FIG. 20, in the conventional search operation, search data is supplied to all TCAM cells in parallel all at once by the search lines SL. As a result, all TCAM cells drive all match lines ML. In general, the basic operation, such as read operation or write operation of a memory is conducted on a limited portion of the whole memory. Unlike this, the search operation is conducted for all TCAM cells in the vertical direction and the horizontal direction. Therefore, power consumption becomes extremely large. For example, the power consumption amounts to 6 W when the capacity is 4 Mbits, and the power consumption amounts to 10 W when the capacity is 9 Mbits. This also makes mounting of the TCAM cells of a large capacity more difficult. In addition, the large power consumption causes a problem that it is difficult to implement a system LSI as a network address search apparatus increased in search operation speed.

In addition, the conventional TCAM typically includes the TCAM 1701 and the priority encoder 1702. Within the TCAM, data having higher priority can be rewritten so as to have a lower entry number. Therefore, if hit in the search operation of the conventional TCAM occurs in a plurality of entries, data having higher priority, i.e., data having a lower entry number is output. For example, an IP address that has come into a state that nobody accesses it is erased on demand (which is called ageing), and rearrangement is conducted again in the order of descending priority.

In fact, this re-addressing is a work of very large overhead. This is because data rewriting must be executed for all entries. During this interval, search operation cannot be accepted. In order to solve these problems, for example, a configuration as shown in FIG. 21 is conceivable. FIG. 21 is a block diagram which shows a configuration example that solves the problems caused when the re-addressing is executed by using the conventional TCAM.

With reference to FIG. 21, each of TCAM 2201 and TCAM 2202 includes the TCAM 1701 and the priority encoder 1702 shown in FIG. 16 as explained above. The TCAM 2201 is connected to a write line 2204 and a search line 2205 via an address decoder 2203. In the same way, the TCAM 2202 is connected to the write line 2204 and the search line 2205 via an address decoder 2206.

According to this configuration, the same data is written into the TCAM 2201 and TCAM 2202. If rewriting of priority occurs, rewriting is executed, for example, for only the TCAM 2201. During that interval, search can be allowed for the TCAM 2202 and a search result is output. As a matter of course, search is executed for only old data preceding rewriting. Subsequently, when rewriting has been completed for the TCAM 2201, the search port is switched from the TCAM 2202 to the TCAM 2201 and the search is executed. When rewriting is necessary, rewriting can be executed for the TCAM 2202. The search command can be executed continuously irrespective of the rewriting command.

In the configuration shown in FIG. 21, however, a plurality of TCAMs are needed although the TCAM itself is very expensive hardware, resulting in a further higher cost. Furthermore, the search speed cannot catch up with requirements of the network system in recent years. Since the power consumption is high, however, improvement of the search speed is very difficult.

That is, the search speed that can be attained with today's TCAM hardware is approximately 100 Mpps (100 megapackets per second) at most. For example, in 40GLAN, however, the commercial demand is (40 Gbits/20 bytes) 250 MHz, i.e., 250 Mpps (250 mega-packets per second). Performance that is 25 times as high as the current performance is needed.

In addition, the conventional TCAM typically has an LSI structure including the TCAM 1701 and the priority encoder 1702 shown in FIG. 16. Thus, the conventional TCAM is not a system LSI including the action memory 1703 as well. In the conventional art, therefore, a TCAM LSI including the TCAM 1701 and the priority encoder 1702, and an action memory LSI having only the action memory 1703 are disposed on a system board. A search result obtained in the TCAM LSI is encoded. The encoded result is input to the action memory LSI. From the viewpoint of application, this configuration is inconvenient to use.

SUMMARY OF THE INVENTION

It is an object of this invention to provide a TCAM cell reduced in area occupied by the cell so as to make it possible to mount TCAM cells of a large capacity on an LSI, a CAM cell array and a TCAM cell array capable of executing the search operation with low power consumption and consequently capable of operating at high speed, an address search memory using such a TCAM cell array, and a network address search apparatus implemented as a system LSI that can be conveniently used.

The content addressable memory cell array according to one aspect of this invention includes a first memory cell array and a second memory cell array. Each of the first and second memory cell arrays includes a plurality of content addressable memory cells arranged in rows and columns, a plurality of search line pairs respectively connected to ones of the content addressable memory cells arranged in the columns, a plurality of match lines respectively connected to ones of the content addressable memory cells arranged in the rows, and a plurality of precharge circuits respectively connected to the match lines, each precharging the match line connected thereto. Each of the content addressable memory cells includes a coincidence comparison circuit comparing data stored in each of the content addressable memory cell with data on the search line pairs connected to each of the content addressable memory cells and providing a comparison result of coincidence or non-coincidence for the match line connected to each of the content addressable memory cells after being precharged. The content addressable memory cell array further includes a plurality of storage circuits storing results of the comparison on the match lines of the first memory cell array, respectively. The content addressable memory cell array also includes a plurality of control circuits provided correspondingly to the storage circuits and controlling the precharge circuits of the second memory cell array, each preventing the precharge circuit to be controlled from precharging the match line connected to the precharge circuit to be controlled when the corresponding storage circuit stores the comparison result of the non-coincidence.

The content addressable memory cell array according to another aspect of this invention includes a first memory cell array and a second memory cell array. Each of the first and second memory cell arrays includes a plurality of content addressable memory cells arranged in rows and columns, a plurality of search line pairs respectively connected to ones of the content addressable memory cells arranged in the columns, and a plurality of match lines respectively connected to ones of the content addressable memory cells arranged in the row. Each of the content addressable memory cells includes a coincidence comparison circuit comparing data stored in each of the content addressable memory cells with data on the search line pairs connected to each of the content addressable memory cells and providing a comparison result of coincidence and non-coincidence for the match line connected to each of the content addressable memory cells. The second memory cell array further includes a plurality of drivers driving search line pairs of the second memory cell array, respectively, and a search control circuit connected to the match lines of the first memory cell array and controlling to prevent the driver from driving the search line pairs of the second memory cell array.

Other objects and features of this invention will become apparent from the following description with reference to the accompanying drawings.

DETAILED DESCRIPTION

Embodiments of the TCAM cell, the TCAM cell array, the address search memory, and the network address search apparatus according to the present invention will be explained in detail below with reference to accompanying drawings.

Figure 1:
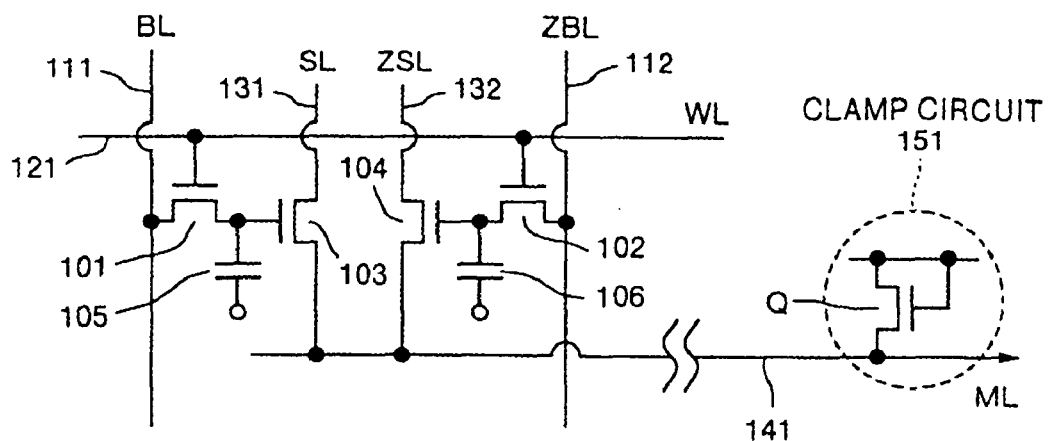
FIG. 1 is a circuit diagram which shows a configuration of a TCAM cell according to a first embodiment of the present invention.

A first embodiment of this invention will be explained below. FIG. 1 is a circuit diagram which shows a configuration of a TCAM cell according to the first embodiment. With reference to FIG. 1, the TCAM cell includes four MOS transistors 101, 102, 103 and 104, and two capacitors 105 and 106. Among them, the MOS transistor 101 and the capacitor 105 form a dynamic memory cell, and the MOS transistor 102 and the capacitor 106 form another dynamic memory cell. The MOS transistors 103 and 104 form a coincidence comparison circuit. A bit line (BL) 111 and a bit line (ZBL) 112 are provided to conduct a write operation, a read operation, and a refresh operation.

The MOS transistor 101 is connected at its drain electrode to the bit line (BL) 111. A storage node of the capacitor 105 is connected to the MOS transistor 101 at its source electrode. The MOS transistor 102 is connected at its drain electrode to the bit line (ZBL) 112. A storage node of the capacitor 106 is connected to the MOS transistor 102 at its source electrode. Each of the MOS transistors 101 and 102 is connected at its gate electrode to a word line (WL) 121 provided to conduct a write operation, a read operation, and a refresh operation.

A search line (SL) 131 and a search line (ZSL) 132 that change in potential level complementarily to each other are bit lines for the search operation. A match line (ML) 141 is an output line provided to output a search result. The MOS transistor 103 is connected at its gate electrode to the storage node of the capacitor 105, and connected at its drain electrode to the search line (SL) 131. The MOS transistor 104 is connected at its gate electrode to the storage node of the capacitor 106, and connected at its drain electrode to the search line (ZSL) 132. Source electrodes of the MOS transistors 103 and 104 are connected to the match line (ML) 141.

According to this configuration, a ternary value of "1", "0" and "X" can be held in the two dynamic memory cells. It can be represented by the following expressions.

If $([1a=1'b0]\&\&[1b=1'b1])$ then WORD$\leq 1'b0$

If $([1a=1'b1]\&\&[1b=1'b0])$ then WORD$\leq 1'b1$

If $([1a=1'b0]\&\&[1b=1'b0])$ then WORD$\leq 1'bx$

Ternary data can be written by keeping the word line (WL) 121 at a high level (hereafter abbreviated to "H" level) and changing the bit line (BL) 111 and the bit line (ZBL) 112 to the "H" level and a low level (hereafter abbreviated to "L" level). For example, "1" is written by providing the bit line (BL) 111 with the "H" level and providing the bit line (ZBL) 112 with the "L" level. "0" is written by providing the bit line (BL) 111 with the "L" level and providing the bit line (ZBL) 112 with the "H" level. "X" is written by providing the bit line (BL) 111 with the "L" level and providing the bit line (ZBL) 112 with the "L" level.

Search data is formed of the "H" level and the "L" level, and is input from the search line (SL) 131 and the search line (ZSL) 132. The coincidence comparison circuit formed of the MOS transistors 103 and 104 conducts comparison as to whether the search data coincides with data held in the cell. A result of the comparison (a result of the search) is output to the match line (ML) 141.

The search line (SL) 131, the search line (ZSL) 132, and the match line (ML) 141 are precharged before the search operation is started. In this embodiment, however, the precharge level is not the Vcc level, but becomes a level of Vcc−Vth obtained by lowering the Vcc level by a threshold Vth.

If the coincidence comparison (the search) results in coincidence, then the coincidence comparison circuit keeps the level of the match line (ML) 141 at the precharge level Vcc−Vth. On the other hand, when the result is non-coincidence, the coincidence comparison circuit conducts operation of pulling out electric charges of the match line (ML) 141 and lowering the level of the match line (ML) 141 to the ground (GND) level. In this embodiment, a clamp circuit 151 is connected to the match line (ML) 141 in order to prevent the match line (ML) 141 from completely falling to the ground (GND) level when the result is non-coincidence.

The clamp circuit 151 is formed of a MOS transistor Q. The MOS transistor Q is connected at its source electrode and gate electrode to a power supply, and connected at its drain electrode to the match line (ML) 141. As a result, it is stopped at, for example, a level of (½) Vcc.

Figure 2:
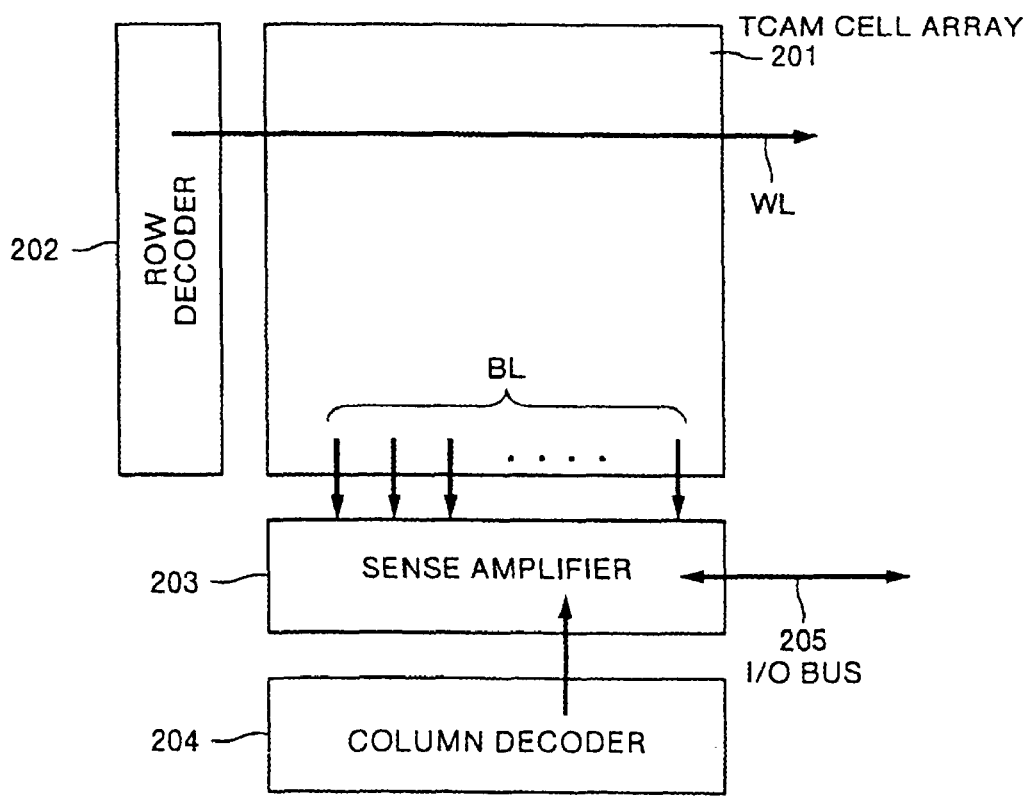
FIG. 2 is a diagram for explaining a read operation and a write operation conducted in the TCAM cell shown in FIG. 1.
Figure 3:
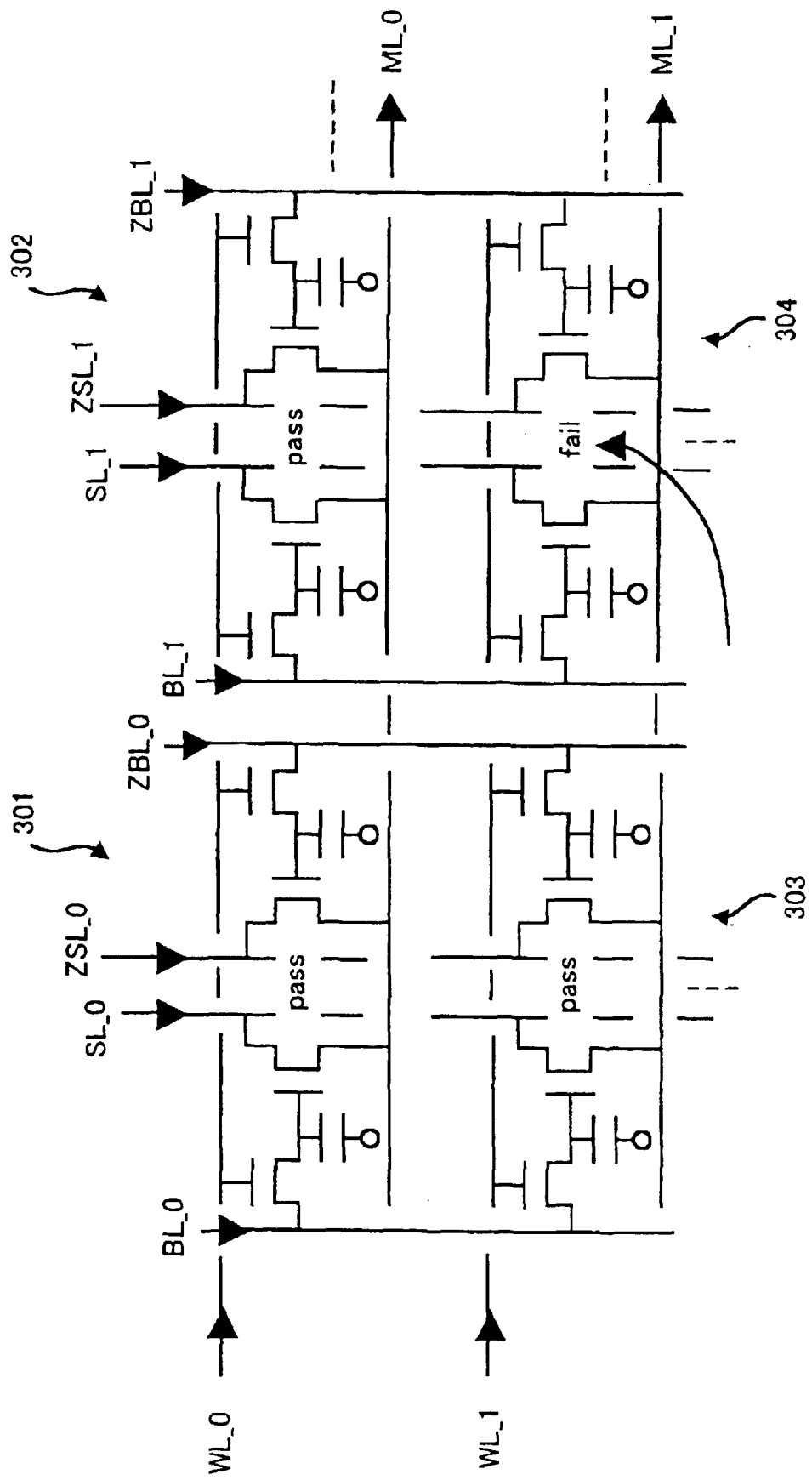
FIG. 3 is a diagram for explaining a search operation conducted in the TCAM cell shown in FIG. 1.
Figure 4:
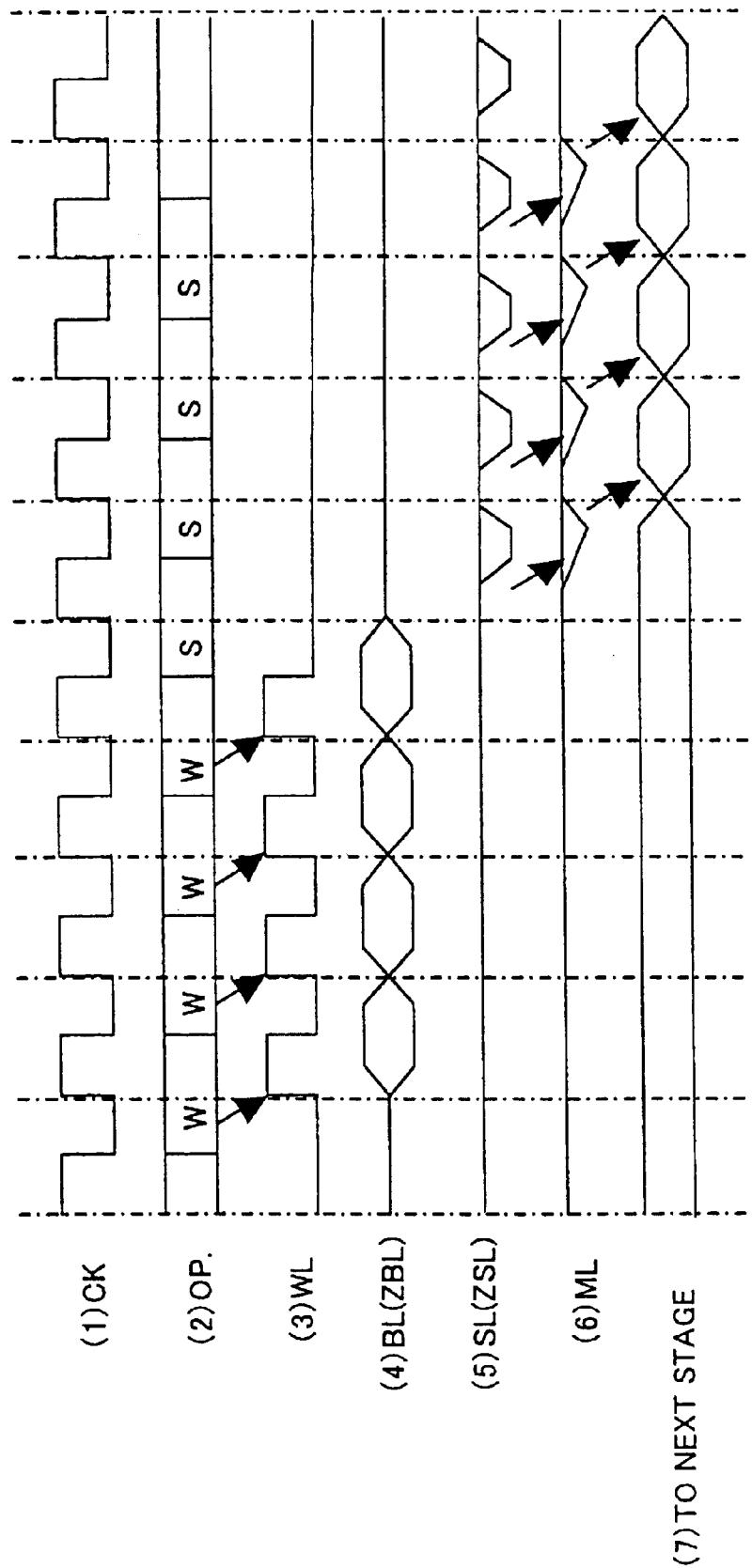
FIG. 4 is an operation time chart of the TCAM cell shown in FIG. 1.

Operation of the TCAM cell according to the first embodiment will now be explained by referring to FIGS. 1 to 4. FIG. 2 is a diagram for explaining a read operation and a write operation conducted in the TCAM cell shown in FIG. 1. FIG. 3 is a diagram for explaining a search operation conducted in the TCAM cell shown in FIG. 1. FIG. 4 is an operation time chart of the TCAM cell shown in FIG. 1.

The read operation and the write operation will be explained by referring to FIG. 2. With respect to an M by N bit TCAM cell array 201 shown in FIG. 2, there are provided a row decoder 202 that controls the word line WL, a sense amplifier 203 that controls the bit line BL, and a column decoder 204 that gives an order to select a column to the sense amplifier 203. An I/O bus 205 is connected to the sense amplifier 203. The bit line BL is a collective representation of the pair of bit lines (BL, ZBL) shown in FIG. 1.

In the read operation conducted in the configuration heretofore explained, one of M word lines WL is first operated by the row decoder 202 to conduct row selection. In each of TCAM cells connected to the activated word line WL, the bit line BL is slightly driven to the "H" level or the "L" level according to data held in the TCAM cell. The sense amplifier 203 speedily amplifies a potential level of the bit line BL in a column selected by the column decoder 204. As a result, data of one pair of bit lines BL included in the N pairs of bit lines BL is sent out from the sense amplifier 203 to the I/O bus 205. In the write operation, data sent from the I/O bus 205 is written into the TCAM cell array 201 in a procedure similar to that explained heretofore.

The search operation will be explained with reference to FIG. 3. In FIG. 3, four TCAM cells 301, 302, 303 and 304 corresponding to two entries having a two-bit length are shown. The TCAM cells 301 and 302 in the row direction are connected to a word line WL__0 and a match line ML__0 of a first entry. The TCAM cells 303 and 304 in the column direction are connected to a word line WL__1 and a match line ML__1 of a second entry. The TCAM cells 301 and 303 in the column direction are connected to bit lines BL__0 and ZBL__0 and search lines SL__0 and ZSL__0. The TCAM cells 302 and 304 in the column direction are connected to bit lines BL__1 and ZBL__1 and search lines SL__1 and ZSL__1. Although not shown, the clamp circuit 151 shown in FIG. 1 is connected to each of the match lines ML__0 and ML__1. It is supposed that high-order bits are held in the TCAM cells 301 and 303 and low-order bits are held in the TCAM cells 302 and 304.

In the search operation, both the search line and the match line are precharged to the "H" level as preparation. In both the search line and the match line, the precharge level is Vcc−Vth as explained earlier. This is a measure taken to reduce the power consumption when charging and discharging are repeated between the "H" level and "L" level.

In this state, the search is started. In other words, search data is supplied to the SL__0 and ZSL__0, and SL__1 and ZSL__1. It is supposed that data represented as SL__0="H", ZSL__0="L", SL__1="L", and ZSL__1="H" is supplied. If in the first entry "H" and "L" are held in the TCAM cell 301 and "L" and "H" are held in the TCAM cell 302, then comparison results in coincidence (in FIG. 3, "pass" and "pass" are shown). Therefore, the match line ML_0 holds the precharge level Vcc−Vth.

On the other hand, if in the second entry "H" and "L" are held in the TCAM cell 303 and "H" and "L" are held in the TCAM cell 304, then coincidence occurs in the TCAM cell 303 (as denoted by "pass") whereas non-coincidence occurs in the TCAM cell 304 of the low-order bit (as denoted by "fail"). As a result, electric charge precharged on the match line ML_1 begins to be discharged toward the search lines SL_1 and ZSL_1 via the coincidence comparison circuit of the TCAM cell 304. The potential of the match line ML_1 begins to fall from the precharge level Vcc−Vth toward the ground (GND) level.

If the match line ML_1 is completely discharged and the potential becomes the ground (GND) level, then in the high-order bit connected to the match line ML_1, i.e., in the TCAM cell 303 the MOS transistor of the coincidence comparison circuit, which is in the off-state, turns on because the cells are decided as coincidence ("pass"). Therefore, a current path is formed between the match line ML_1 and the search line SL_0 or the search line ZSL_0 via the MOS transistor that has turned on.

In this embodiment, however, the match line ML_1 is prevented from lowering to the ground (GND) level by the clamp circuit 151 (see FIG. 1) provided on the match line ML_1. The match line ML_1 falls to, for example, (½) Vcc and keeps that level. In the current example, therefore, the source potential of the MOS transistor of the coincidence comparison circuit becomes (½) Vcc in the TCAM cell 303. Since the operation threshold of the MOS transistor is raised by a substrate effect of the transistor, the MOS transistor does not turn on and false operation is not caused.

FIG. 4 is a time chart which collectively shows the write operation, read operation, and the search operation explained heretofore. With reference to FIG. 4, (1) Respective operations are executed in order in accordance with a clock CK. (2) As command OP, four write commands W continue, and then four search commands S continue. (3) In response to the write command W, the word line WL assumes in MOS level the "H" level or the "L" level. In other words, the word line WL has an amplitude of the MOS level. (4) At the same time, the bit line BL (ZBL) changes to the "H" level and the "L" level in a complementary manner. It also has the MOS level amplitude. (5) The search line SL (ZSL) has a precharge level Vcc−Vth. In response to the search command S, it changes between the Vcc−Vth level and the ground (GND) level in a complementary manner. In other words, it changes with an amplitude that is far smaller than the MOS level amplitude. (6) In the same way, the match line ML also has a precharge level Vcc−Vth. In response to a comparison result, it changes between the Vcc−Vth level and the ground (GND) level. In other words, it changes with an amplitude that is far smaller than the MOS level amplitude. (7) The level of the match line ML is amplified to the original MOS level and then transferred to the next stage.

Figure 18:
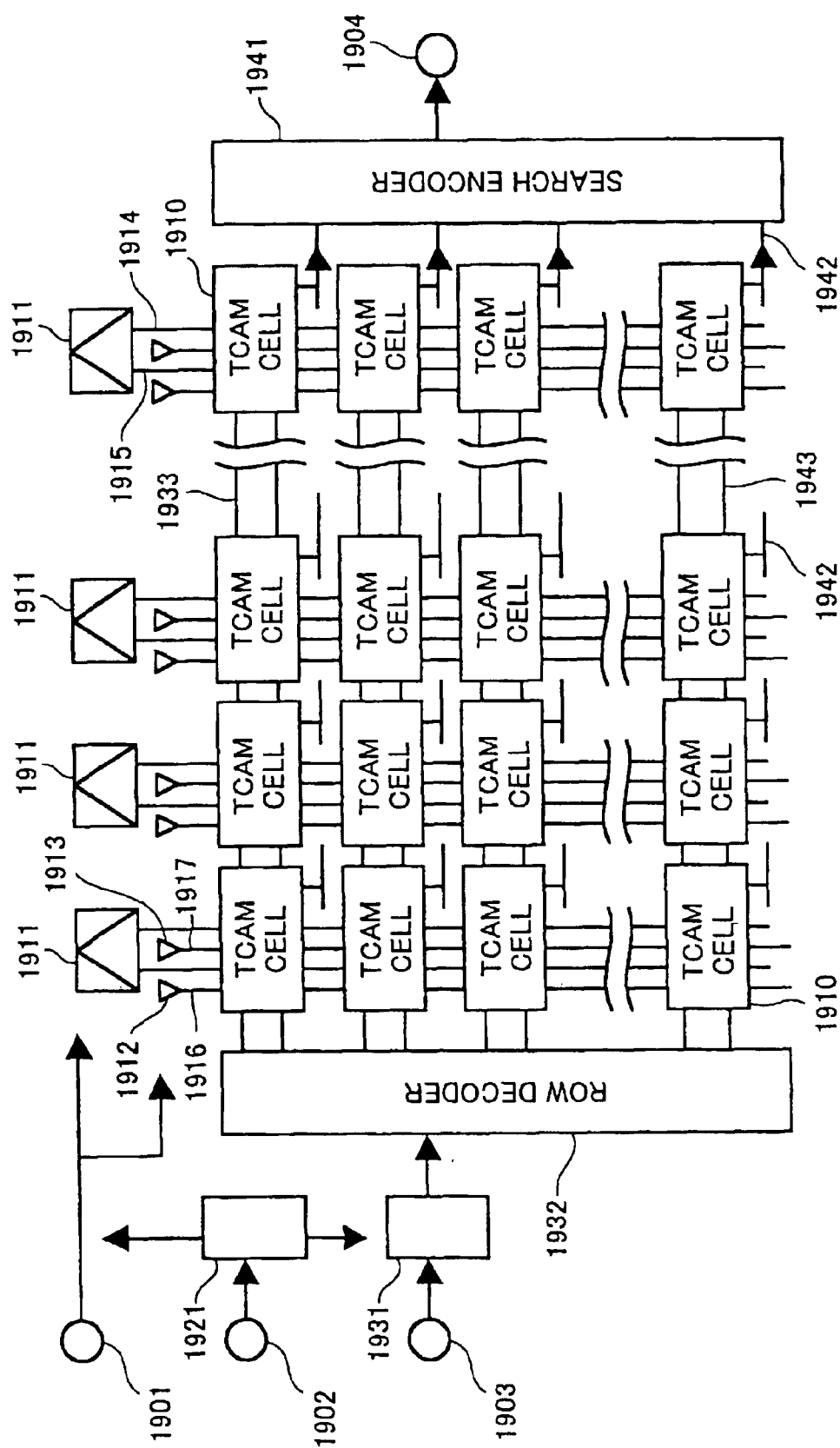
FIG. 18 is a block diagram which shows a detailed configuration of the TCAM.
Figure 19:
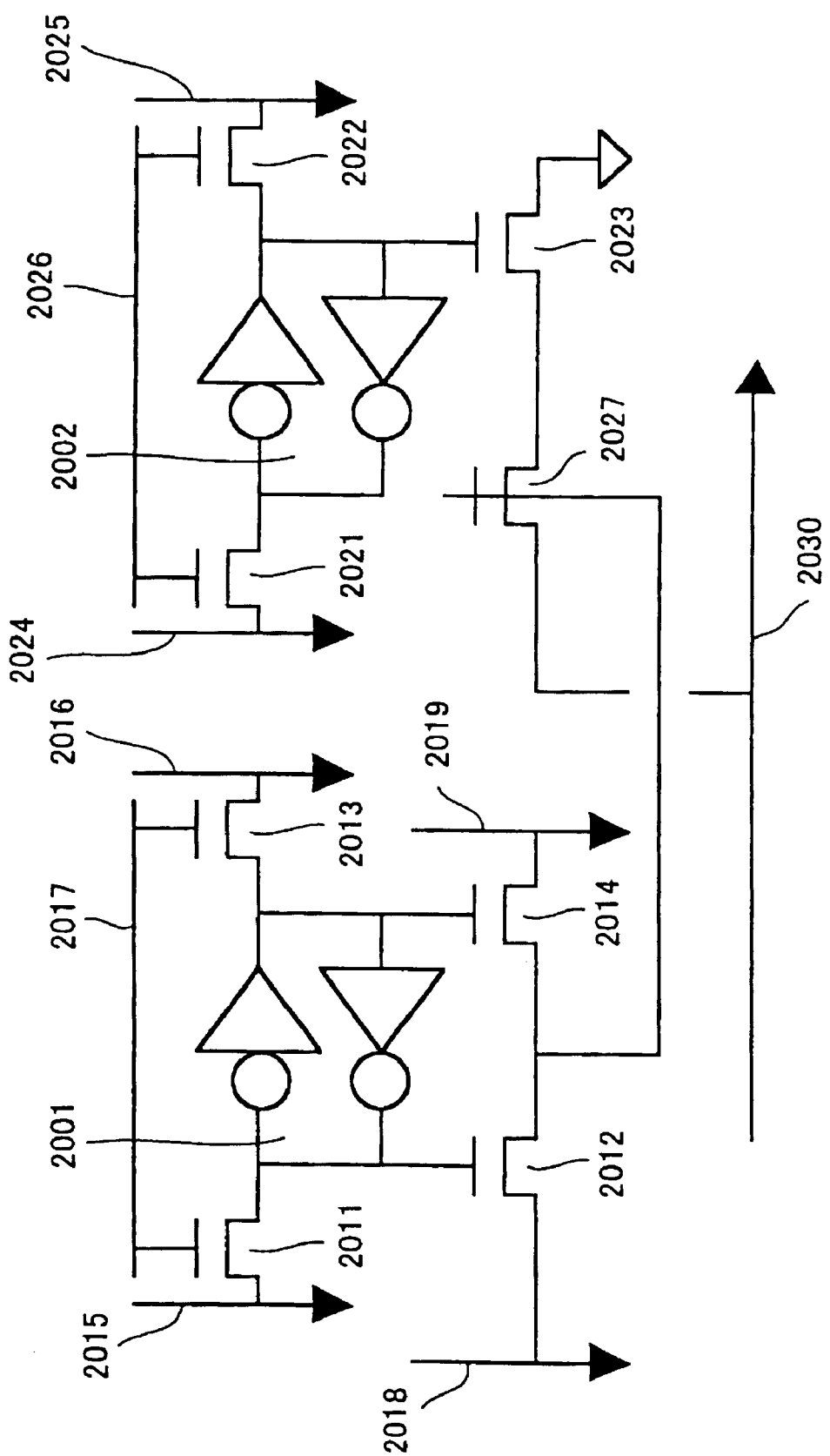
FIG. 19 is a concept diagram which shows a configuration of the conventional TCAM cell shown in FIG. 18.
Figure 20:
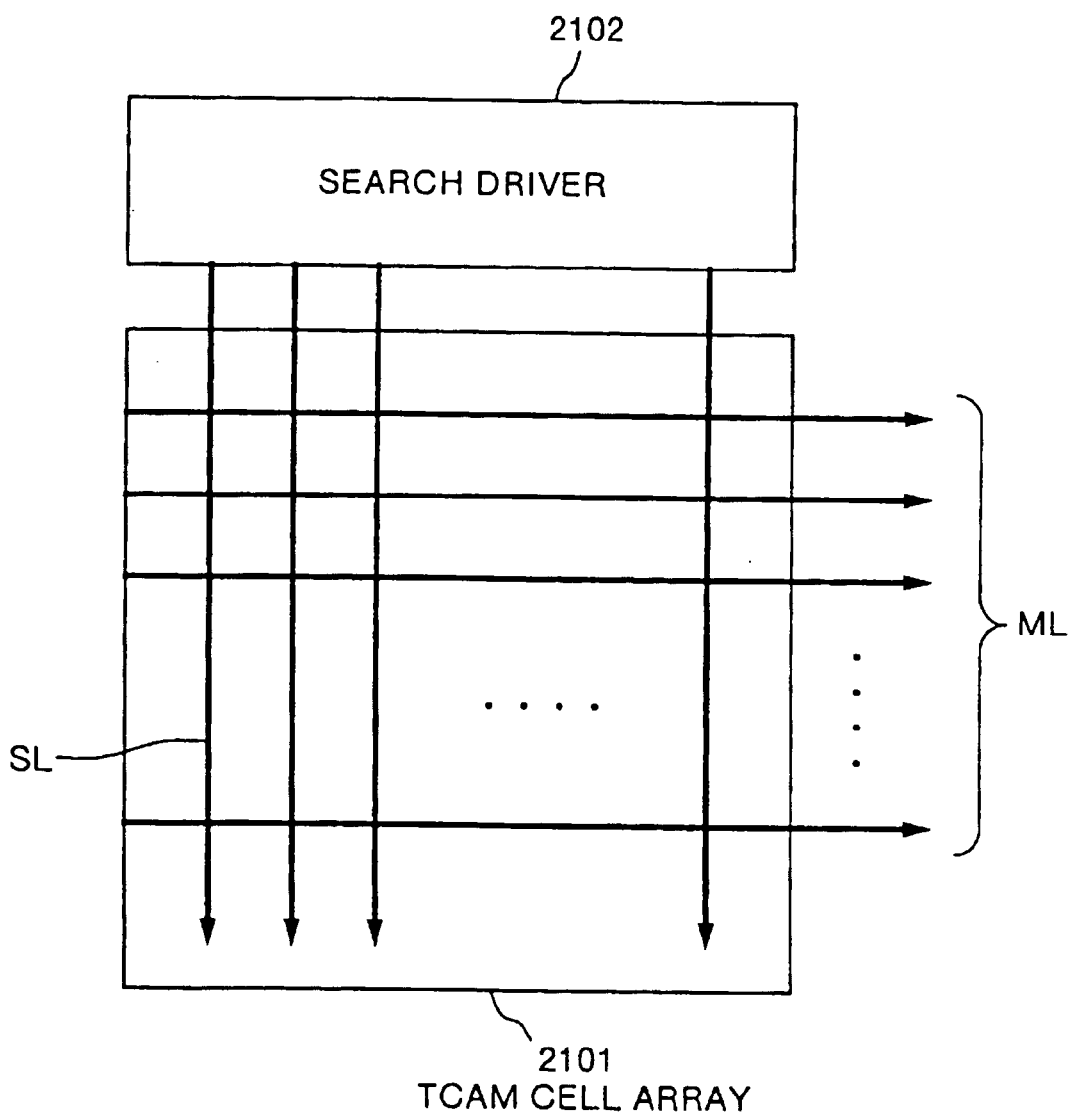
FIG. 20 is a diagram which shows a search operation conducted in the conventional TCAM shown in FIG. 18.
Figure 21:
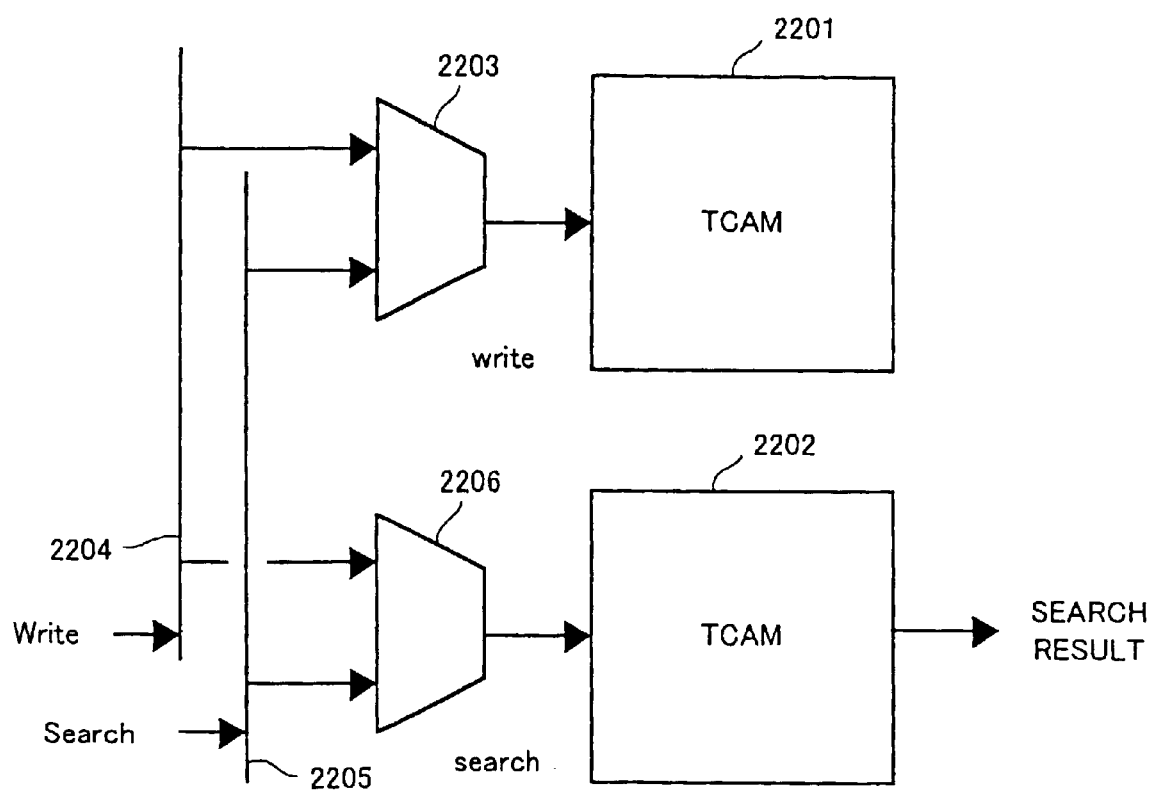
FIG. 21 is a block diagram which shows a configuration example that solves problems caused at the time of re-addressing by using the conventional TCAM.

Thus, according to the first embodiment, the TCAM cell is formed of four MOS transistors and two capacitors. Therefore, the area occupied by the cell can be made small. When forming an LSI, TCAM cells of a large capacity can be mounted on the LSI. To be concrete, if the same design technology as that of the conventional art (FIG. 18) is used, then TCAM cells of a capacity that is approximately four times as large as that of the conventional art can be mounted. For example, if a 0.13 µm technology is used, the capacity is approximately 9 Mbits at the most in the conventional art. According to the first embodiment, however, a capacity of up to approximately 27 Mbits can be mounted. In addition, since the operation voltage range of the search line and the match line is limited so as to cause the search line and the match line to operate with a low voltage amplitude, the low power consumption at the time of the search operation can also be attained.

Figure 5:
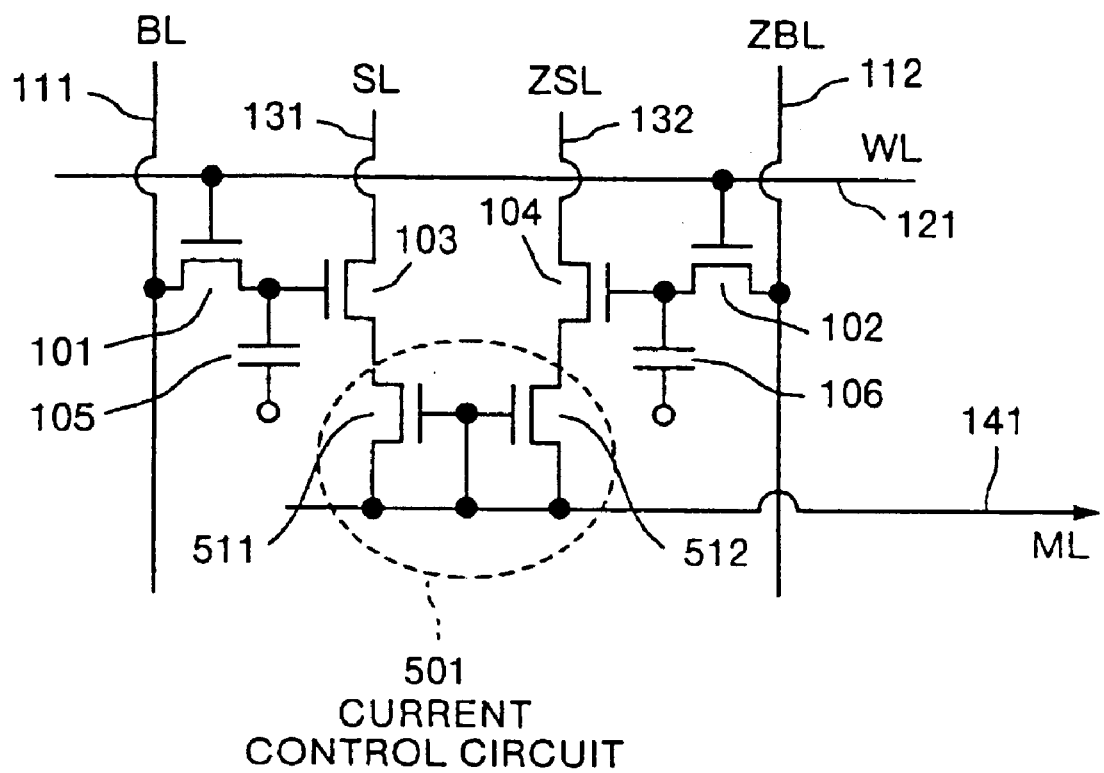
FIG. 5 is a circuit diagram which shows a configuration of a TCAM cell according to a second embodiment of the present invention.

A second embodiment of this invention will be explained below. FIG. 5 is a circuit diagram which shows the configuration of a TCAM cell according to the second embodiment. In FIG. 5, components that are the same as or equivalent to those of the dynamic TCAM cell shown in FIG. 1 are denoted by like characters. The second embodiment will be explained mainly on a part concerning the second embodiment.

In the dynamic TCAM cell according to the second embodiment as shown in FIG. 5, a current control circuit 501 is provided between the coincidence comparison circuit (MOS transistors 103 and 104) and the match line (ML) 141 instead of the clamp circuit 151 shown in FIG. 1. The remaining parts have the same configuration as that of FIG. 1.

The current control circuit 501 includes a MOS transistor 511 provided between the MOS transistor 103 and the match line (ML) 141, and a MOS transistor 512 provided between the MOS transistor 104 and the match line (ML) 141. Gate electrodes of the MOS transistors 511 and 512 are connected in common to the match line (ML) 141.

If the decision in the coincidence comparison circuit (MOS transistors 103 and 104) at the time of the search operation is non-coincidence and the potential of the match line (ML) 141 is lowered by pulling out the electric charge of the match line (ML) 141, then in the configuration, the current control circuit 501 limits the current that flows through the coincidence comparison circuit (MOS transistors 103 and 104). As explained with reference to the first embodiment, therefore, the potential of the match line (ML) 141 can be kept at the level of, for example, (½) Vcc instead of the ground (GND) level. Therefore, an operation effect similar to that of the first embodiment is obtained.

Figure 6:
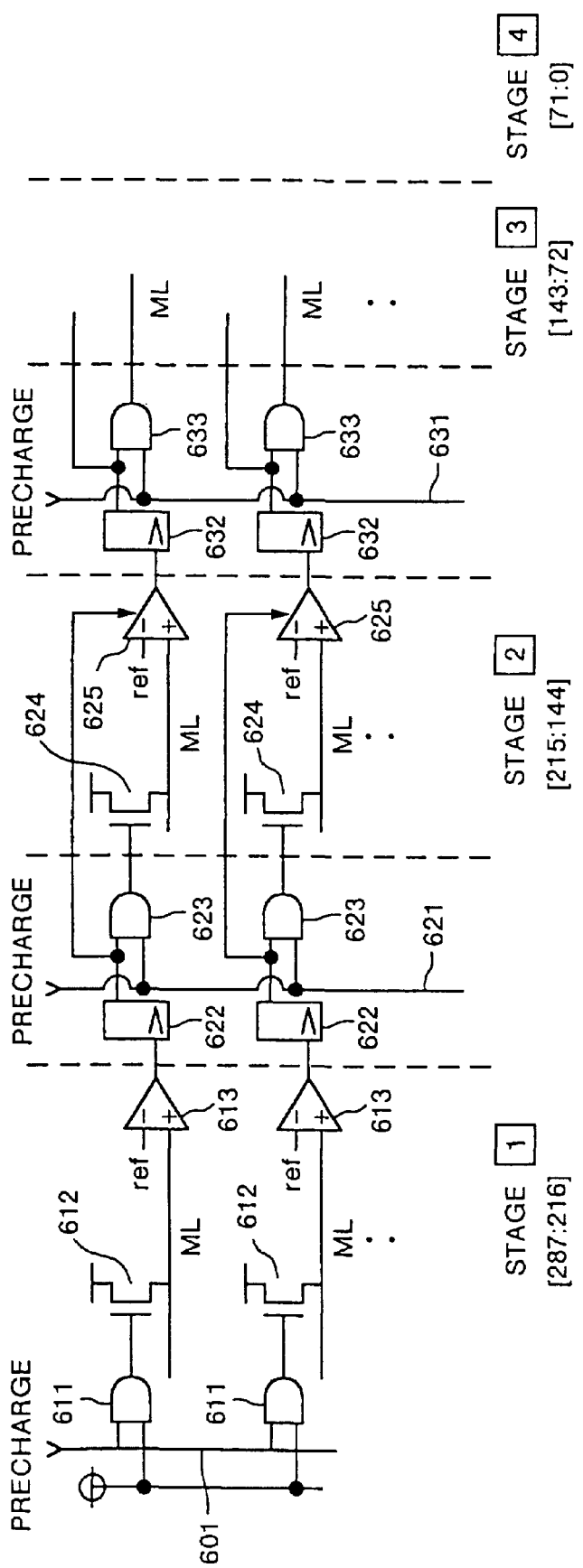
FIG. 6 is a block diagram which shows a configuration of a TCAM cell array that implements a low power consumption search operation according to a third embodiment of the present invention.

A third embodiment of this invention will be explained below. FIG. 6 is a block diagram which shows the configuration of a TCAM cell array that implements a low power consumption search operation according to the third embodiment. In this embodiment, the whole TCAM cell array including the dynamic TCAM cells shown in the first embodiment (FIG. 1) or the second embodiment (FIG. 5) is divided into, for example, four subarrays, and a search operation is executed every subarray. By thinning the match line in order, i.e., hierarchically at this time, a lowpower consumption search operation is implemented.

If the whole TCAM cell array includes, for example, 288 bits, then it is divided into four subarrays [287:216], [215:144], [143:72], and [71:0] as shown in FIG. 6. In this figure, the subarray [287:216], the subarray [215:144], the subarray [143:72] and the subarray [71:0] are denoted by stage 1, stage 2, stage 3, and stage 4, respectively. The stages are coupled in the so-called pipeline system.

In the stage 1, input terminals of an AND gate 611 are connected to a precharge line 601 and a power supply line, and an output terminal of the AND gate 611 is connected to a MOS transistor 612 at its gate electrode. The MOS transistor 612 is connected at its source electrode to a power supply. The MOS transistor 612 is connected at its drain electrode to the match line ML. As a result, the match line ML is precharged to the level of Vcc−Vth before the search operation is started. The match line ML is connected to a positive phase input terminal (+) of an amplifier 613. A negative phase input terminal (−) is supplied with a reference voltage "ref".

In the stage 1, the search operation is conducted on entries of the whole bit group of [287:216]. Since a match line ML, when data coincides with each other, holds the level of Vcc−Vth, an amplifier 613 connected with the match line ML becomes the "H" level of the MOS level at its output. On the other hand, on a match line ML, when data is not coincident, a level drop occurs and its level falls from the level of Vcc−Vth to a level of, for example, (½)Vcc. As a result, the amplifier 613 connected with the match line ML becomes the "L" level of the MOS level at its output.

A precharge stage that couples the stage 1 to the next stage 2 includes a pipeline register 622 that receives an output of the amplifier 613, and an AND gate 623 connected with an output terminal of the pipeline register 622 and a precharge line 621. When an output of a corresponding amplifier 613 is the "H" level, the output of the pipeline resistor 622 becomes the "H" level. When an output of a corresponding amplifier 613 is the "L" level, the output of the pipeline resistor 622 becomes the "L" level. Therefore, among the AND gates 623, only an AND gate 623 corresponding to a pipeline register 622 that is outputting the "H" level becomes the "H" level at its output.

The stage 2 includes a MOS transistor 624 and an amplifier 625. The MOS transistor 624 is connected at its gate electrode to an output terminal of the AND gate 623, connected at its source electrode to a power supply, and connected at its drain electrode to the match line ML. The match line ML is connected to a positive phase input terminal (+) of the amplifier 625. A negative phase input terminal (−) of the amplifier 625 is supplied with the reference voltage "ref". The output terminal of the pipeline register 622 is connected to a control signal input terminal of the amplifier 625.

In other words, in the stage 2, only a match line ML concerning an AND gate 623 that has received an output of a pipeline register 622 outputting the "H" level among the pipeline registers 622 is precharged. Only an amplifier 625 connected with that match line ML conducts an amplification operation, and transfers a result of the search to the subsequent stage 3. In the stage 2, therefore, the search operation is not executed for entries of the whole bit group of [215:144], but the search operation is executed only on match lines ML where it is determined that data is coincident in the preceding stage 1. At this time, each of the match lines ML, where it is determined that data is not coincident in the preceding stage 1, maintains the (½) Vcc level and is not affected by the potential change of the search line (SL, ZSL). As a result, false operation is not caused.

A precharge stage that couples the stage 2 to the next stage 3 includes a pipeline register 632 that receives an output of the amplifier 625, and an AND gate 633 connected with an output terminal of the pipeline register 632 and a precharge line 631. Although not shown, the stage 3 and subsequent stages have similar configurations.

Figure 7:
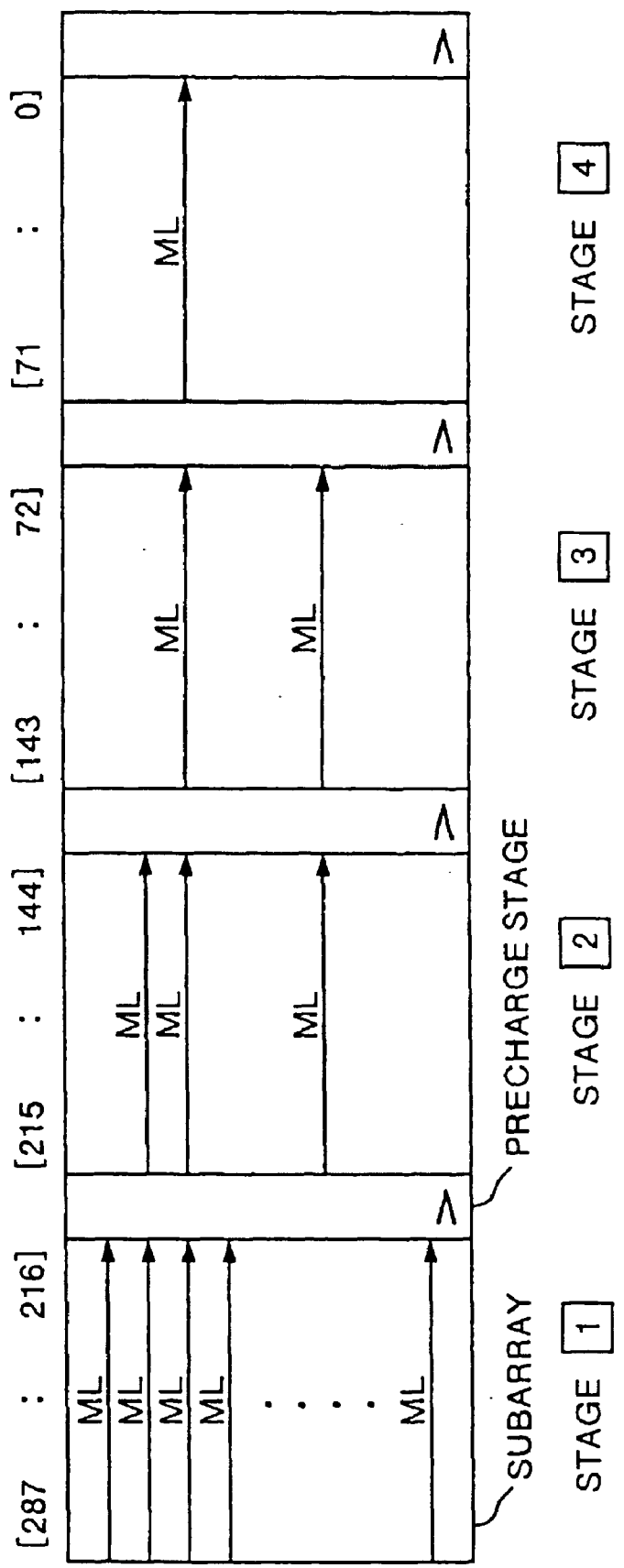
FIG. 7 is a diagram which shows the low power consumption search operation conducted in the TCAM cell array shown in FIG. 6.

The low power consumption search operation according to the third embodiment will be explained by referring to FIG. 7. If the whole TCAM cell array includes, for example, 288 bits, then it is divide into four subarrays [287:216], [215:144], [143:72], and [71:0] as shown in FIG. 7 in the same way as FIG. 6. The subarray [287:216], the subarray [215:144], the subarray [143:72] and the subarray [71:0] are denoted by stage 1, stage 2, stage 3 and stage 4, respectively. The stages are coupled in the so-called pipeline system.

In entries of the whole bit group of [287:216] of the stage 1 shown in FIG. 7, a search operation is conducted on all search lines and all match lines. Match lines ML where it is determined that data is coincident in the stage 1 are detected, and the stage 2 is notified of the detected match lines ML via the precharge stage.

In the stage 2, a search operation is conducted on entries concerning the match lines, where it is determined that data is coincident in the stage 1, included in the whole bit group of [215:144]. Coincident match lines are narrowed down, and the stage 3 is notified of the match lines narrowed down.

Thus, in the stage 2, the whole bit group of [215, 144] is not necessarily the target of the search. Therefore, the power consumption can be reduced. In the stage 3, the target match lines are further narrowed down. In the stages 3 and 4 as well, the power consumption is further reduced in the same way. In this way, the power consumption is reduced hierarchically.

Power dissipated in the search operation includes three major components. A first component is charging and discharging (a) of the search line. A second component is charging and discharging (b) of the match line. A third component is activation (c) of the amplifier. Power consumption will now be explained while dividing it into the components.

It is now supposed that the TCAM cell array has N entries of bits [287:0]. For example, it is further supposed that 20 entries among N entries hit (coincide) in the search of the stage 1 and 10 entries hit in the stage 2. It is further supposed that 3 entries hit in the stage 3 and 1 entry finally coincides with search data 288 bits in the stage 4.

In the stage 1, power consumption in this instance becomes [N entries×288 bits]a+[N entries×288 bits]b+[N entries×288 bits]c. In the stage 2, power consumption becomes [N entries×288 bits]a+[20 entries×288 bits]b+[20 entries×288 bits]c. In the stage 3, power consumption becomes [N entries×288 bits]a+[10 entries×288 bits]b+[10 entries×288 bits]c. In the stage 4, power consumption becomes [N entries×288 bits]a+[3 entries×288 bits]b+[3 entries×288 bits]c.

Power consumption in the conventional TCAM cell array will now be represented by using the similar components. In all stages, all entries become targets of the search. Therefore, in the stage 1 to the stage 4, the power consumption becomes equally [N entries×288 bits]a+[N entries×288 bits]b+[N entries×288 bits]c. From this as well, it will be appreciated that the power consumption is reduced remarkably in the third embodiment.

Thus, according to the third embodiment, the hierarchical search method is adopted in the search operation specific to TCAM. In the hierarchical search method, the search operation is not conducted over the whole memory array. For example, if data has M entries each having an N-bit length, then a search is first effected on N/2 high-order bits of all entries. Subsequent N/2 low-order bits of only entries that have indicated coincidence become the target of a search.

Therefore, the power consumption at the time of search operation can be reduced. If at this time, the time required for the search becomes long, the performance is degraded. In order to prevent the performance degradation, so-called pipeline connection is used for operation between bits and thereby a throughput rate is ensured.

Figure 8:
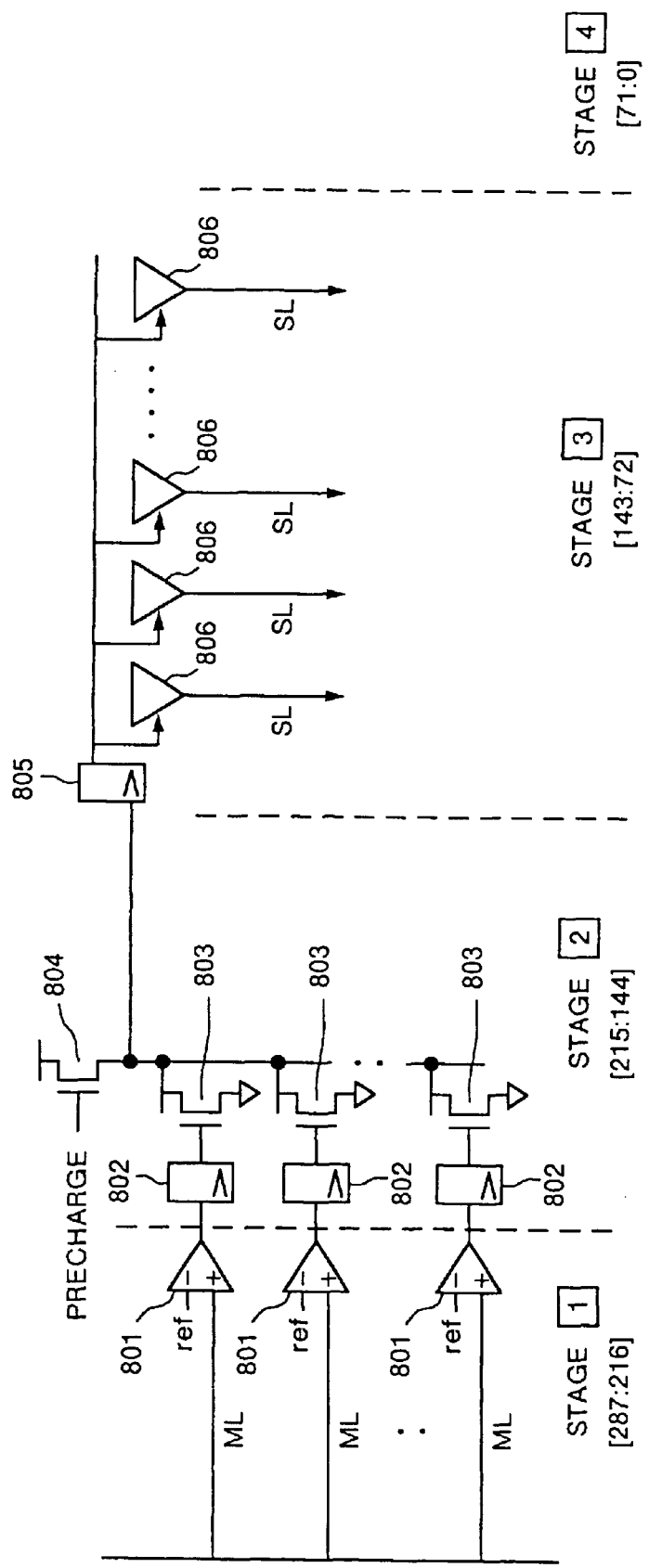
FIG. 8 is a block diagram which shows a configuration of a TCAM cell array that implements a low power consumption search operation according to a fourth embodiment of the present invention.

A fourth embodiment of this invention will be explained below. FIG. 8 is a block diagram which shows the configuration of a TCAM cell array that implements a low power consumption search operation according to the fourth embodiment. In this embodiment, the whole TCAM cell array including the dynamic TCAM cells shown in the first embodiment (FIG. 1) or the second embodiment (FIG. 5) is divided into, for example, four subarrays and a search operation is executed every subarray. At that time, not only match lines but also search lines are thinned. As a result, a low power consumption search operation is implemented.

As shown in FIG. 8, if the whole TCAM cell array includes, for example, 288 bits in the same way as the third embodiment, then the whole TCAM cell array is divided into four subarrays [287:216], [215:144], [143:72], and [71:0]. In FIG. 8, the subarray [287:216], the subarray [215:144], the subarray [143:72] and the subarray [71:0] are denoted by stage 1, stage 2, stage 3 and stage 4, respectively. The stages are coupled in the so-called pipeline system.

In the stage 1, the potential state (search result) of each match line ML is amplified to the MOS amplitude level by an amplifier 801 in the same way as the third embodiment. In the stage 2, there are included a pipeline register 802 that takes in an output of the amplifier 801, and a MOS transistor 803 supplied at its gate electrode with an output of the pipeline register 802. Drain electrodes of a plurality of MOS transistors 803 are connected to the ground (GND). Source electrodes of the MOS transistors 803 are wired-OR connected in common to a MOS transistor 804 at its drain electrode.

The drain electrode of the MOS transistor 804 is connected to an input terminal of a pipeline register 805 in the stage 3. Drive circuits 806 for search lines SL are connected in parallel to an output terminal of the pipeline register 805.

In short, the potential state (search result) of each of the match lines ML is amplified, and the search result is transferred to the stage 2. In the stage 2, search results are wire-ORed and it is determined whether there is no coincidence in every entry. The wire-ORed signal is supplied to the drive circuits 806 of the search lines via the pipeline register 805, and control is conducted so that a part of the search lines SL is driven or the whole of the search lines SL is suspended.

Figure 9:
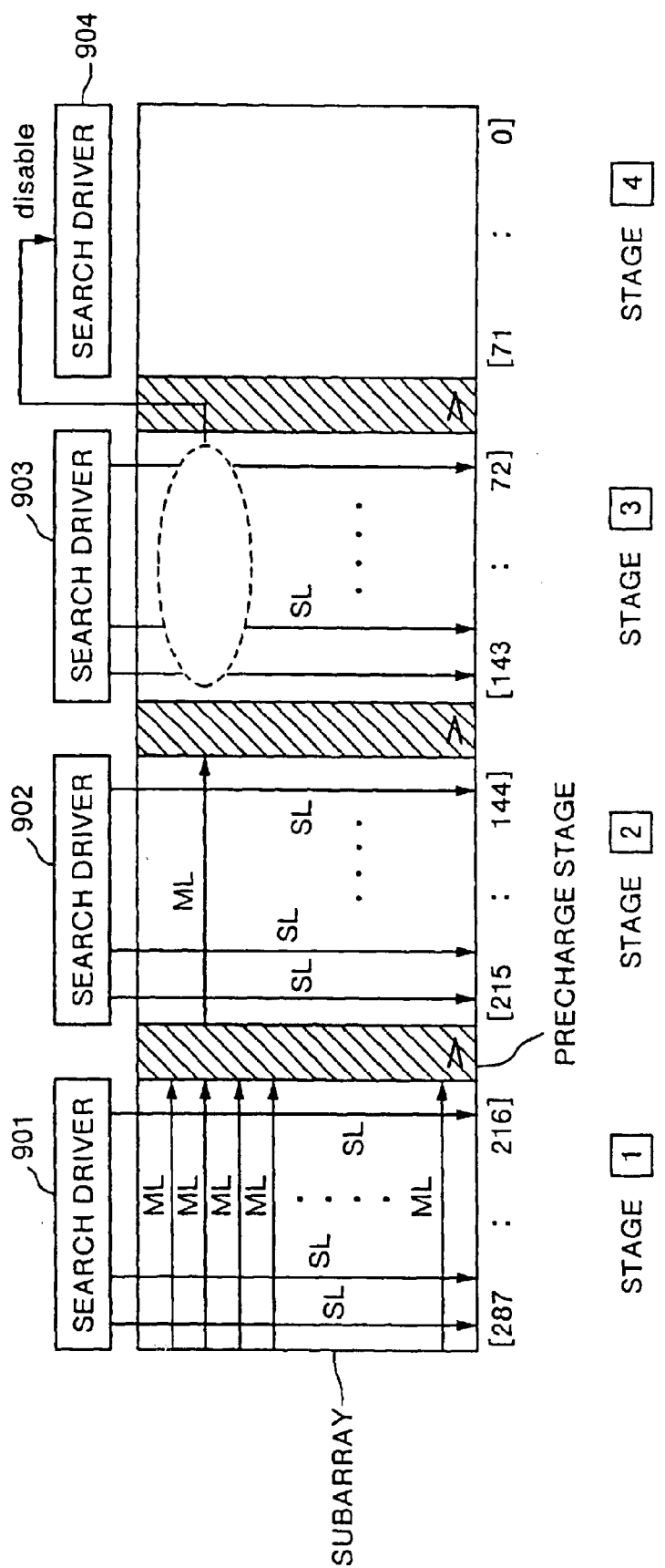
FIG. 9 is a diagram which shows the low power consumption search operation conducted in the TCAM cell array shown in FIG. 8.

A low power consumption search operation according to the fourth embodiment will be explained with reference to FIG. 9. If the whole TCAM cell array includes, for example, 288 bits, then it is divided into four subarrays [287:216], [215:144], [143:72], and [71:0] as shown in FIG. 9 in the same way as FIG. 8. The subarray [287:216], the subarray [215:144], the subarray [143:72] and the subarray [71:0] are denoted by stage 1, stage 2, stage 3 and stage 4, respectively. The stages are coupled in the so-called pipeline system. Search drivers 901, 902, 903 and 904, which serve as drive circuits of the search lines SL, are provided in the subarrays.

In the stage 1, all search lines SL and all match lines ML become the target of the search operation. In the stage 2, all search lines SL and partial match lines ML become the target of the search operation. It is supposed that there are no match lines ML at all in the stage 3. In other words, it is supposed that when a data sequence that coincides with search data arrives at the stage 3 it is already found that the data sequence does not exist in this subarray.

In this instance, a disable signal is sent to the search driver 904 that serves as a generation source for not only match lines ML but also search lines SL in the stage 4 in order to stop the operation. According to the fourth embodiment, therefore, an operation effect as that of the third embodiment is obtained.

Figure 10:
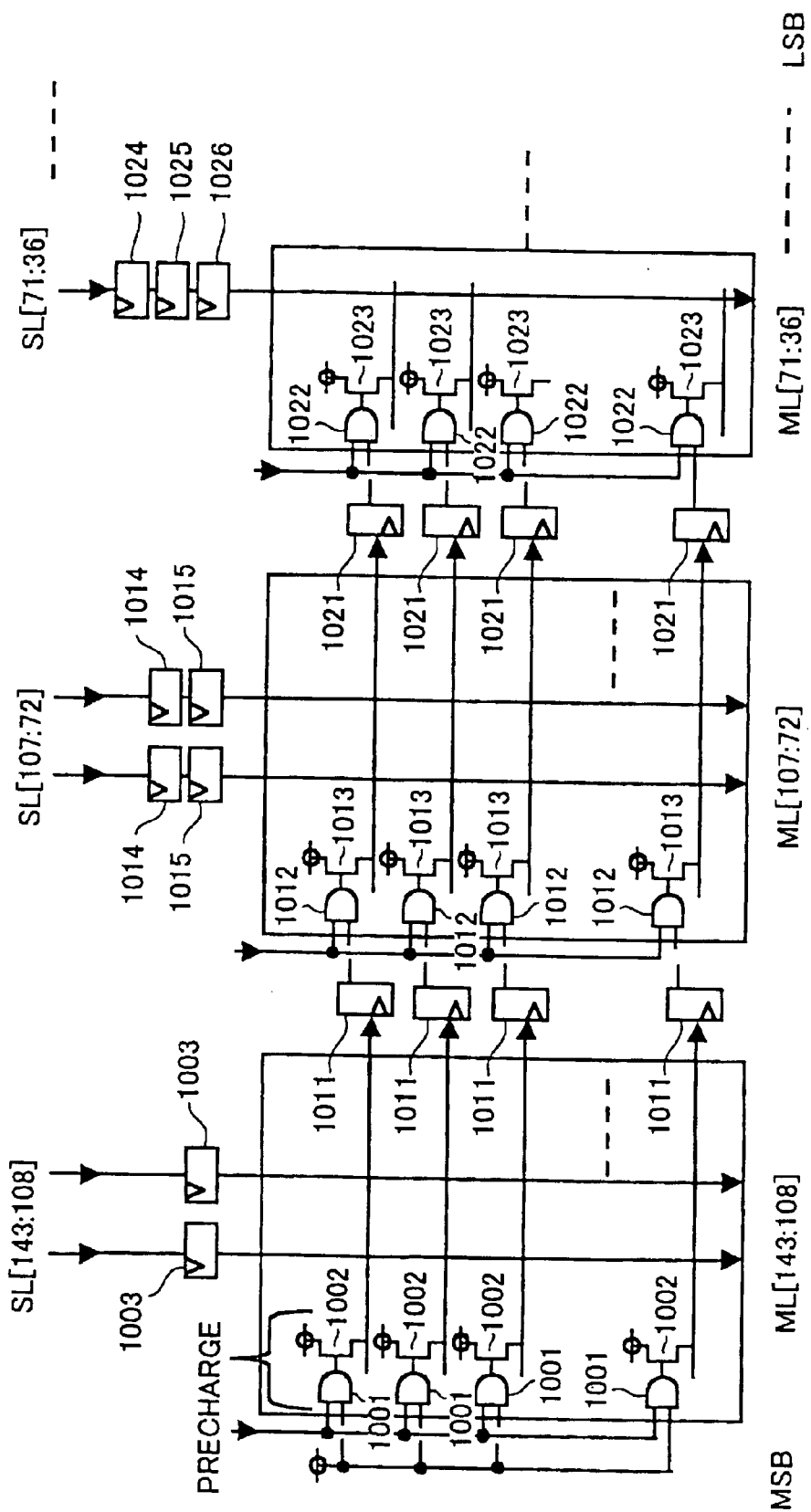
FIG. 10 is a block diagram which shows a configuration of a TCAM cell array that implements a low power consumption search operation according to a fifth embodiment of the present invention.

A fifth embodiment of this invention will be explained below. FIG. 10 is a block diagram which shows the configuration of a TCAM cell array that implements a low power consumption search operation according to the fifth embodiment. In this embodiment, a configuration example is shown as follows. In the example, when the whole TCAM cell array including the dynamic TCAM cells shown in the first embodiment (FIG. 1) or the second embodiment (FIG. 5) is divided into subarrays and a search operation is executed every subarray, timing on the match lines and the search lines is aligned.

If the whole TCAM cell array includes, for example, 143 bits, then it is divided into subarrays [143:108], [107:72], [71:36], . . . as shown in FIG. 10.

In the subarray of [143:108], each match line ML is provided with an AND gate 1001 connected at its input terminals to a precharge line and a power supply line, and a MOS transistor 1002 which receives an output of the AND gate 1001 and executes precharge of the match line ML. A potential state (search result) of the match line ML is taken into a pipeline register 1011. On the other hand, one register 1003 for timing adjustment is provided for each search line SL.

In the subarray of [107:72], each match line ML is provided with an AND gate 1012 connected at its input terminals to a precharge line and an output terminal of the pipeline register 1011, and a MOS transistor 1013 which receives an output of the AND gate 1012 and executes precharge of the match line ML. A potential state (search result) of the match line ML is taken into a pipeline register 1021. On the other hand, two registers 1014 and 1015 for timing adjustment are provided for each search line SL.

In the subarray of [71:36], each match line ML is provided with an AND gate 1022 connected at its input terminals to a precharge line and an output terminal of the pipeline register 1021, and a MOS transistor 1023 which receives an output of the AND gate 1022 and executes precharge of the match line ML. A potential state (search result) of the match line ML is taken into a pipeline register of the next stage, which is not shown, in the same way. On the other hand, three registers 1024, 1025 and 1026 for timing adjustment are provided for each search line SL.

According to this configuration, the problem of timing posed when a plurality of subarrays are coupled by using pipelines is resolved.

Figure 11:
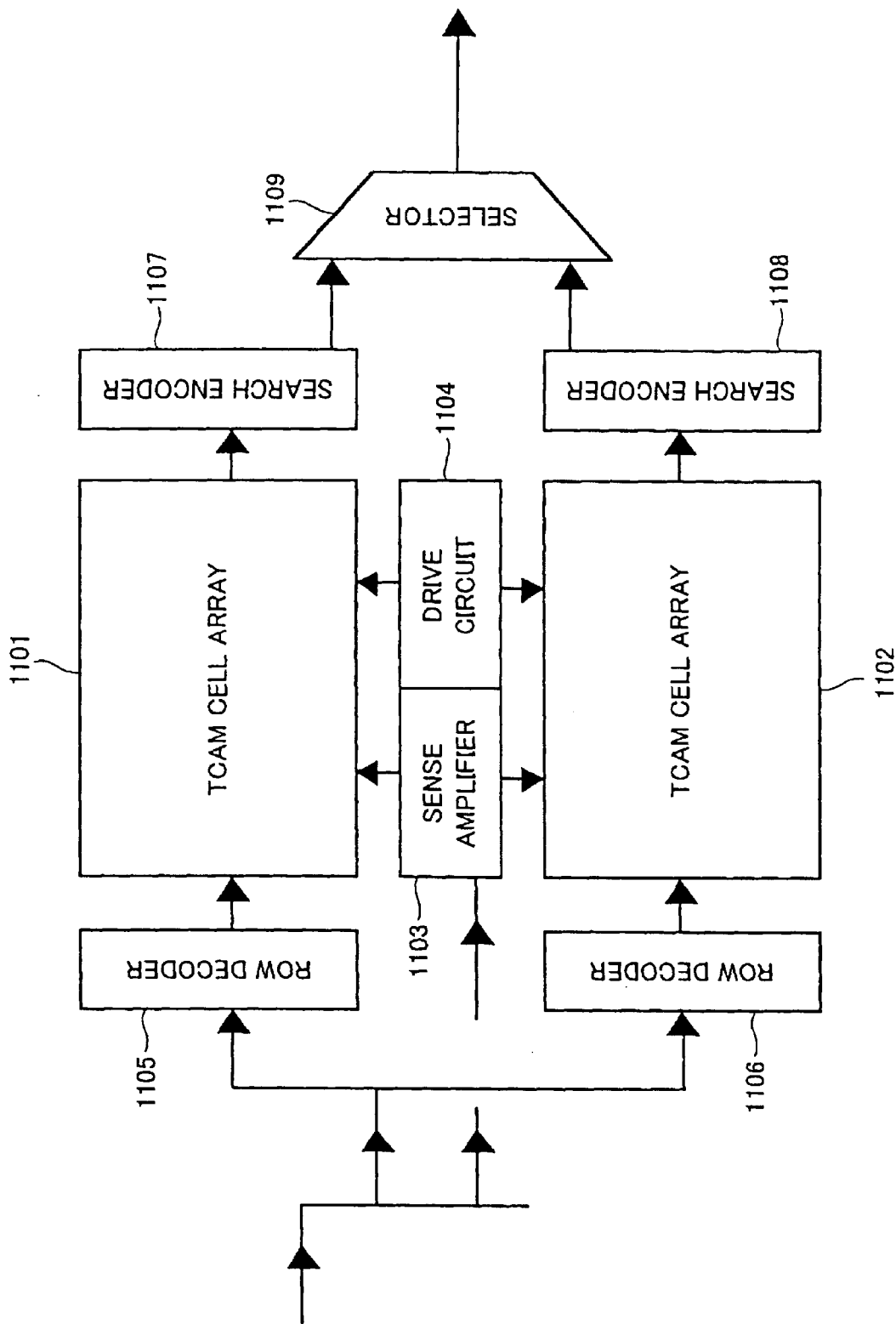
FIG. 11 is a block diagram which shows a configuration of an address search memory according to a sixth embodiment of the present invention.

A sixth embodiment of this invention will be explained below. FIG. 11 is a circuit diagram which shows the configuration of an address search memory according to the sixth embodiment. In FIG. 11, each of TCAM cell arrays 1101 and 1102 arranged in parallel includes the dynamic TCAM cells shown in the first embodiment (FIG. 1) or the second embodiment (FIG. 5). Between the TCAM cell arrays 1101 and 1102, a drive circuit 1104 and a sense amplifier 1103 are provided. The drive circuit 1104 includes a write drive circuit and a search drive circuit.

For the TCAM cell arrays 1101 and 1102, row decoders 1105 and 1106 and search encoders 1107 and 1108 are provided independently of each other. Outputs of the search encoders 1107 and 1108 are output to the outside via a selector 1109.

Figure 12:
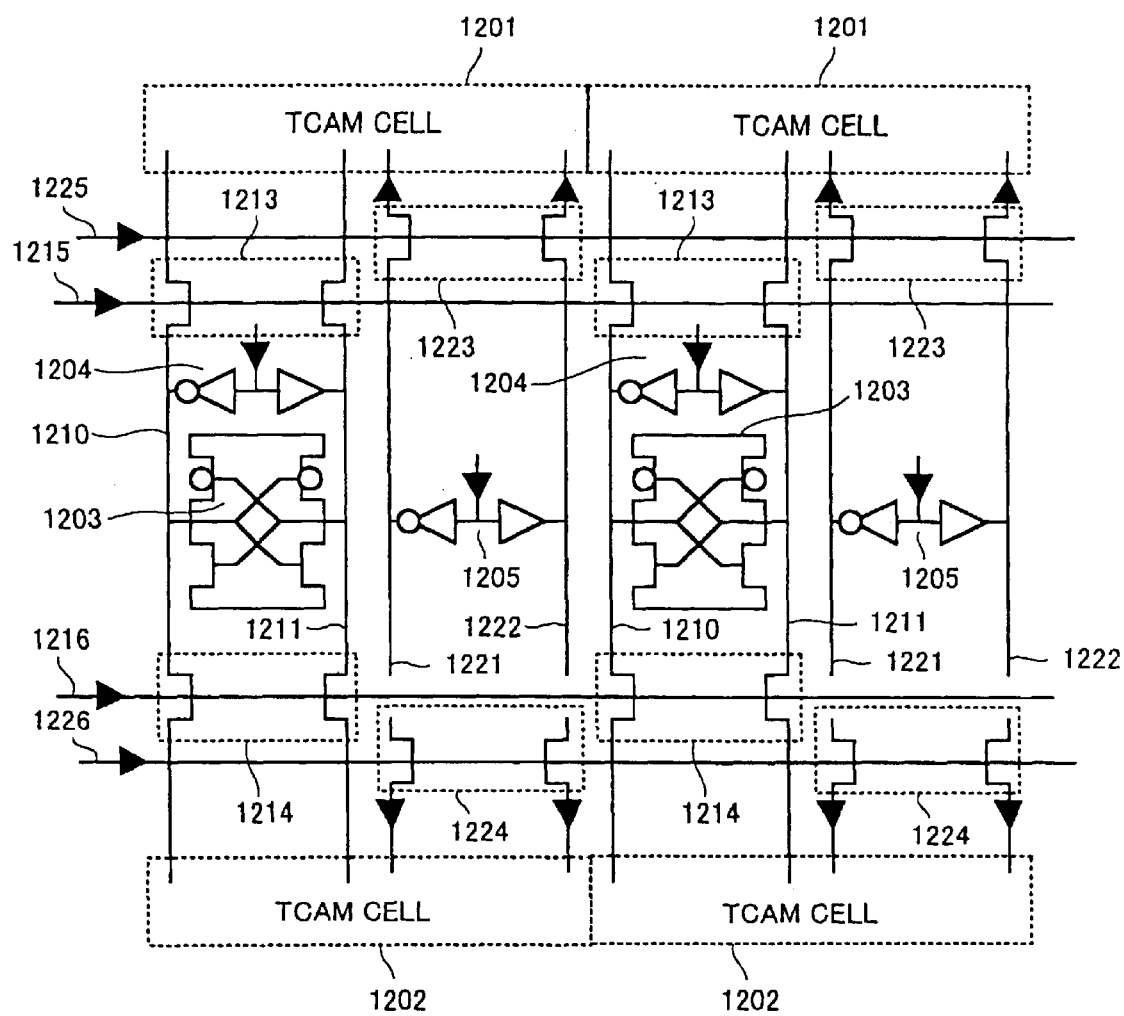
FIG. 12 is a circuit diagram which shows relations among TCAM cells included in each of two TCAM cell arrays disposed in parallel as shown in FIG. 11, and sense amplifiers and drive circuits disposed between the TCAM cells.

FIG. 12 is a circuit diagram which shows relations among the TCAM cells of two TCAM cell arrays arranged in parallel, and the sense amplifier and the drive circuit arranged between the two TCAM cell arrays. In FIG. 12, TCAM cells 1201 and 1201 are two adjacent TCAM cells included in the TCAM cell array 1101 shown in FIG. 11. In the same way, TCAM cells 1202 and 1202 are two adjacent TCAM cells included in the TCAM cell array 1102 shown in FIG. 11.

The TCAM cell 1201 and the TCAM cell 1202 are connected to each other by complementary bit lines 1210 and 1211 provided to execute write, read, and refresh operations, and complementary search lines 1221 and 1222 provided to conduct a search operation.

For the bit lines 1210 and 1211, buffer circuits 1213 and 1214 formed of MOS transistors are provided on the way. The MOS transistors in the buffer circuits 1213 and 1214 can be controlled so as to turn on/off by control lines 1215 and 1216. A sense amplifier 1203 and a write drive circuit 1204 are disposed between the buffer circuits 1213 and 1214. The sense amplifier 1203 and the write drive circuit 1204 are connected to the bit lines 1210 and 1211.

For the search lines 1221 and 1222, buffer circuits 1223 and 1224 formed of MOS transistors are provided on the way. The MOS transistors in the buffer circuits 1223 and 1224 can be controlled so as to turn on/off by control lines 1225 and 1226. A search line drive circuit 1205 is disposed between the buffer circuits 1223 and 1224. The search line drive circuit 1205 is connected to the search lines 1221 and 1222.

An operation of the address search memory according to the sixth embodiment will now be explained by referring to FIGS. 11 and 12. The following three operation modes are possible in the address search memory according to this embodiment. A first operation mode is an operation mode using the TCAM cell arrays 1101 and 1102 as one memory space. In other words, one of a write command and a search command is supplied to both the TCAM cell arrays 1101 and 1102. According to this, the operation is limited to one of the write operation and the search operation, but it is possible to implement a slow, large-capacity operation mode in which a large memory space can be used.

With reference to FIG. 12, one of the buffer circuits 1213 and 1214 is turned on by one of the control lines 1215 and 1216 when conducting the write, read, and refresh operations. At this time, both the buffer circuits 1223 and 1224 are turned off by the control lines 1225 and 1226. As a result, the TCAM cell arrays 1101 and 1102 can be used as one continuous memory region.

On the other hand, at the time of the search operation, to the contrary, both the buffer circuits 1223 and 1224 are turned on by the control lines 1225 and 1226. Both the buffer circuits 1213 and 1214 are turned off by the control lines 1215 and 1216.

A second operation mode is an operation mode in which the TCAM cell arrays 1101 and 1102 are used as respectively independent memory spaces. That is, the same data is written in the TCAM cell arrays 1101 and 1102. If rewriting becomes necessary, the rewriting is executed for only an array of one side by using a write buffer in a common sense amplifier 103 provided between the TCAM cell arrays 1101 and 1102. For the other array, the search operation can be executed without interruption by using a common search line drive circuit 1104 provided between the TCAM cell arrays 1101 and 1102.

With reference to FIG. 12, both the buffer circuits 1213 and 1214 are turned on by the control lines 1215 and 1216 when conducting the write, read, and refresh operations. At this time, both the buffer circuits 1223 and 1224 are turned off by the control lines 1225 and 1226. As a result, the same data is stored in the TCAM cell arrays 1101 and 1102. The memory region is reduced to half.

If rewriting becomes necessary, for example, if rewriting is to be executed on the TCAM cell array 1101, then only the buffer circuit 1213 is turned on by the control line 1215. On the TCAM cell array 1102, a search can be conducted by turning on the buffer circuit 1224 by using the control line 1226.

When re-addressing has become necessary, the search command can be executed continuously irrespective of the rewrite command. Therefore, since the sense amplifier shared by both arrays can be formed at a low cost, it becomes possible to provide an address search apparatus that can meet a search speed demanded by network systems in recent years, at a low price.

A third operation mode is a mode in which a search operation for both arrays is executed at high speed in such a state that the same data has been written into both arrays in the second mode. At an "H" edge of a system clock, the buffer circuit 1223 shown in FIG. 12 is turned on by the control line 1225 whereas the buffer circuit 1224 is turned off by the control line 1226, and the TCAM cell array 1101 is searched. At an "L" edge of the system clock, the buffer circuit 1223 is turned off by the control line 1225 whereas the buffer circuit 1224 is turned on by the control line 1226, and the TCAM cell array 1102 is searched.

According to this, the memory region is reduced to half, but the search operation speed is doubled. For example, if the system clock runs at 125 MHz, a high speed search operation of 250 MHz as a whole becomes possible.

Outputs of the TCAM cell arrays 1101 and 1102 in the operations are output independently from the search encoders 1107 and 1108 as parallel data or serial data, and output to the outside via the selector 1109.

Figure 13:
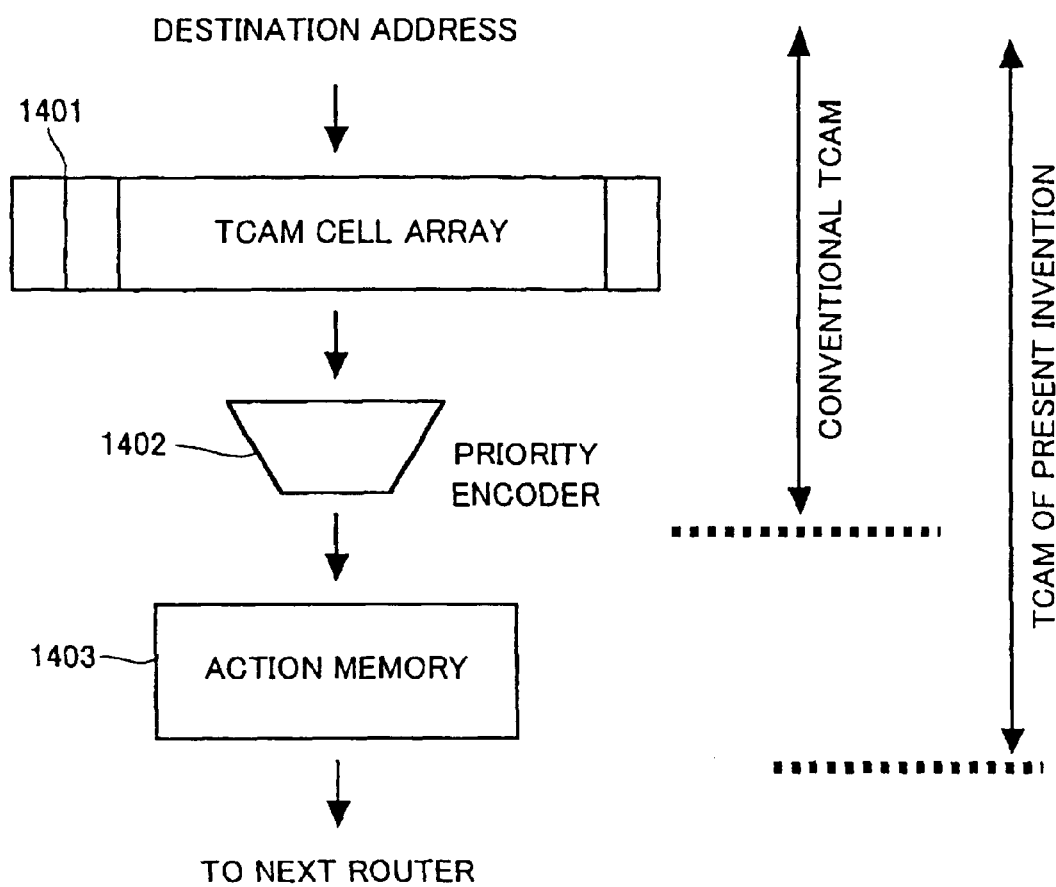
FIG. 13 is a block diagram which shows a configuration of a system LSI that functions as a network address search apparatus, according to a seventh embodiment of the present invention.

A seventh embodiment of this invention will be explained below. FIG. 13 is a block diagram which shows the configuration of a system LSI that functions as a network address search apparatus according to the seventh embodiment.

As heretofore explained, the TCAM cell according to the first embodiment (FIG. 1) includes four MOS transistors and two capacitors. The TCAM cell according to the second embodiment (FIG. 5) includes six MOS transistors and two capacitors. Therefore, the occupied area is remarkably reduced, and cells of a large capacity can be mounted. According to the third to fifth embodiments (FIGS. 6 to 10), a hierarchical partial search can be conducted. Therefore, the power consumption can be remarkably reduced.

In other words, according to this invention, the degree of integration of a TCAM that conducts special search operation can be further improved. As shown in FIG. 13, therefore, the conventional TCAM is an LSI including the TCAM cell array 1401 and the priority encoder but incapable of including the action memory 1403. According to this invention, a system LSI including the action memory 1403 as well can be formed.

As explained earlier, what is actually needed from the standpoint of application is not an entry number indicated by a TCAM, but an action for the next hop. According to this invention, therefore, it becomes possible to form a system LSI functioning as a network address search apparatus that is excellent in convenience to use.

Figure 14:
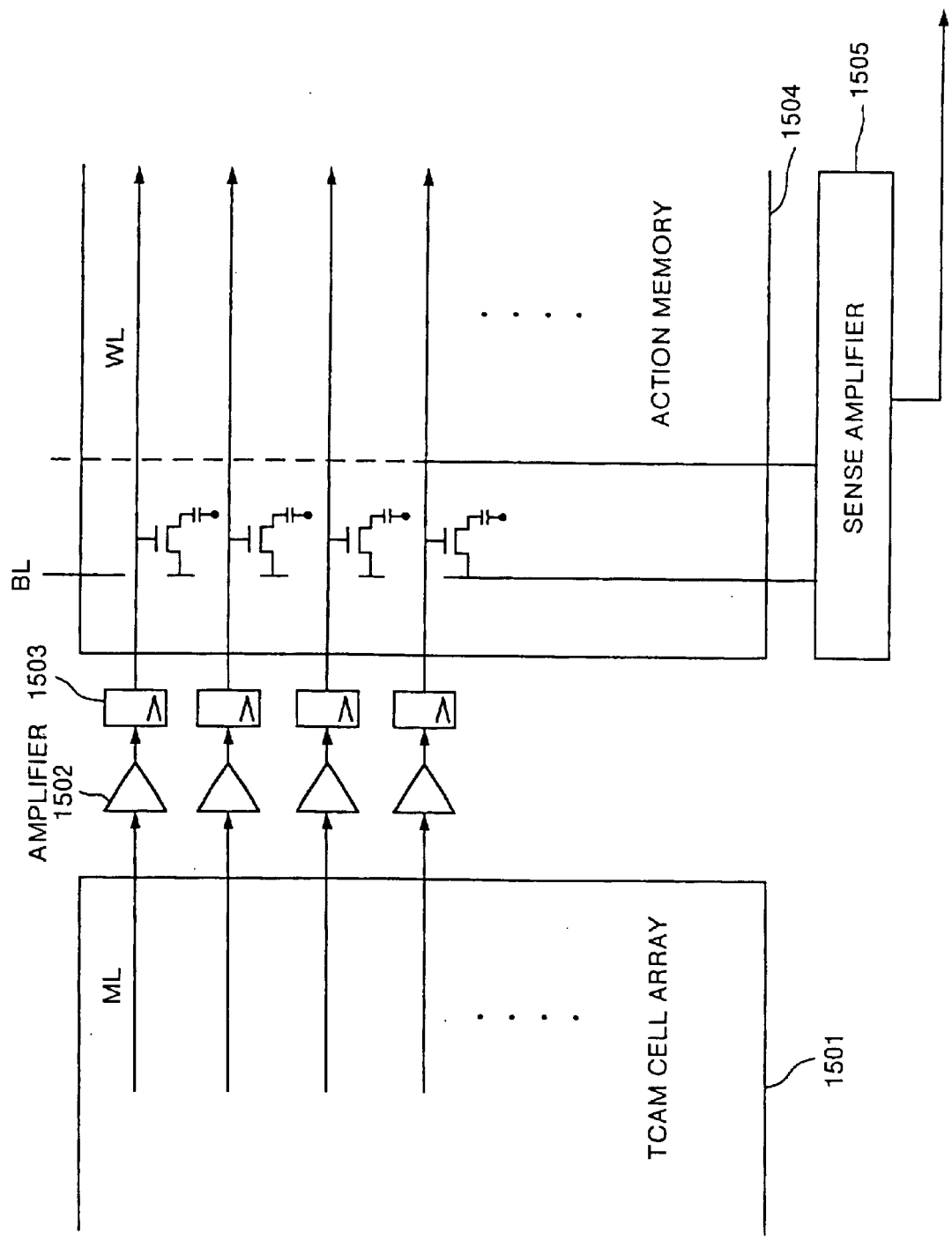
FIG. 14 is a block diagram which shows a concrete configuration of the system LSI that functions as a network address search apparatus shown in FIG. 13.
Figure 15:
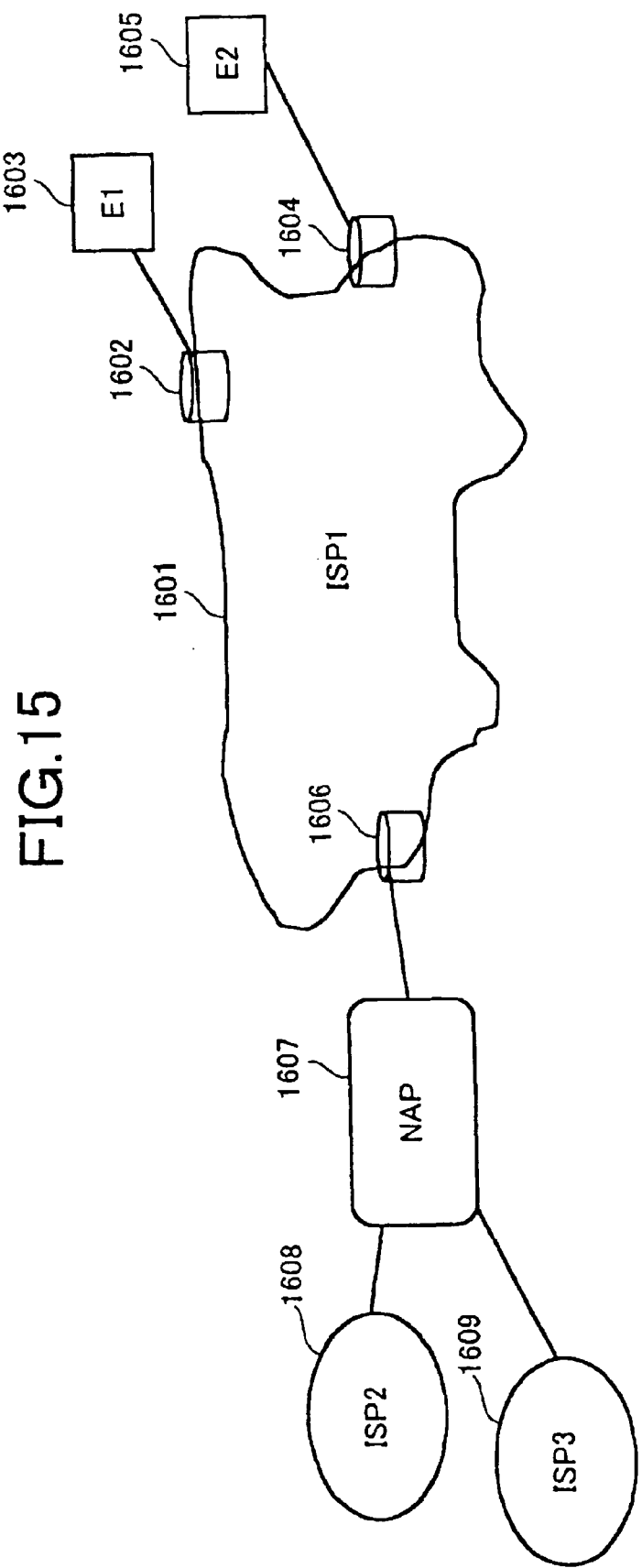
FIG. 15 is a diagram which shows a configuration example of a network system in which a TCAM serving as an address search apparatus is used.
Figure 16:
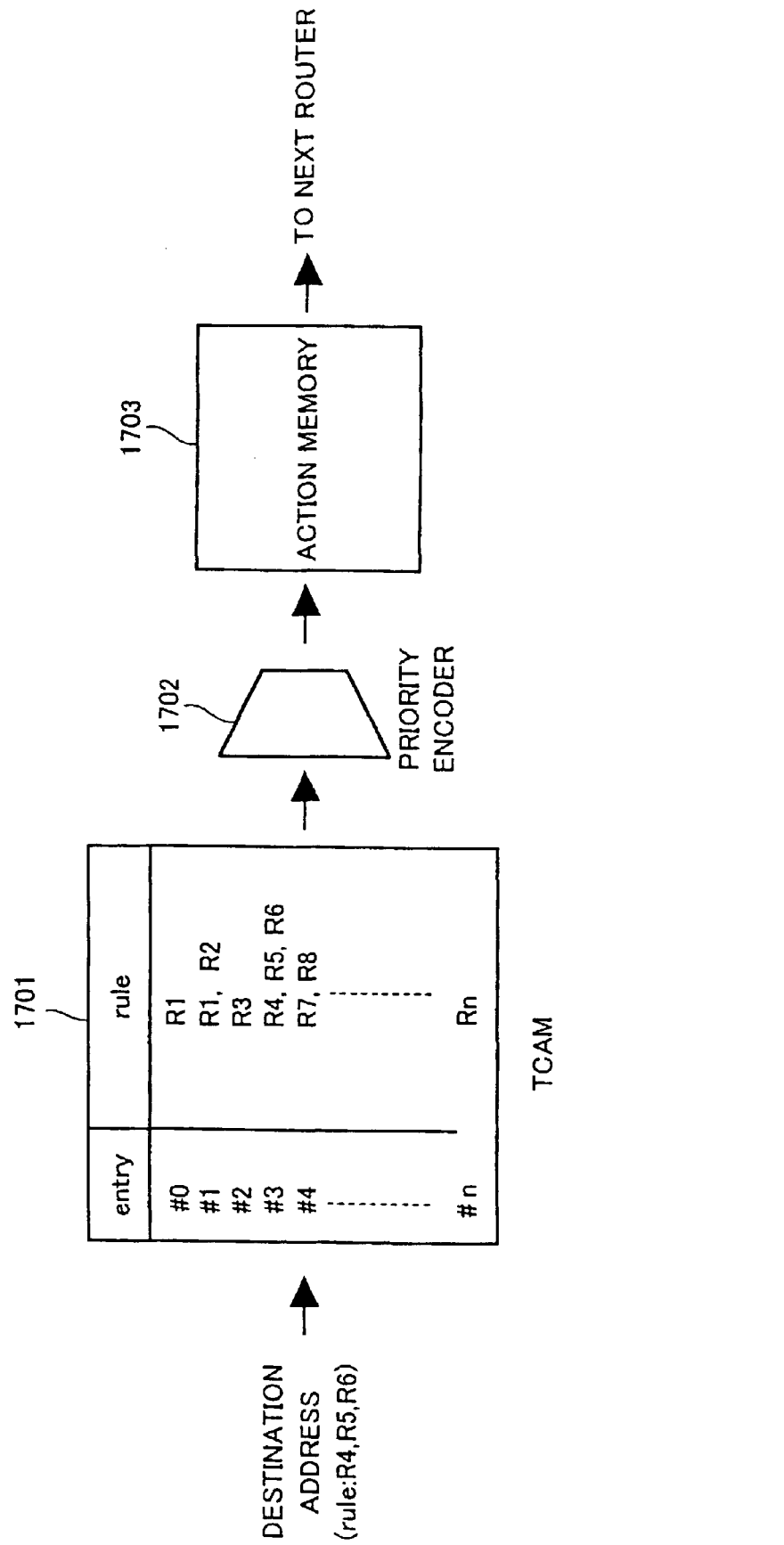
FIG. 16 is a diagram which shows a packet classification algorithm using hardware processing.
Figure 17:
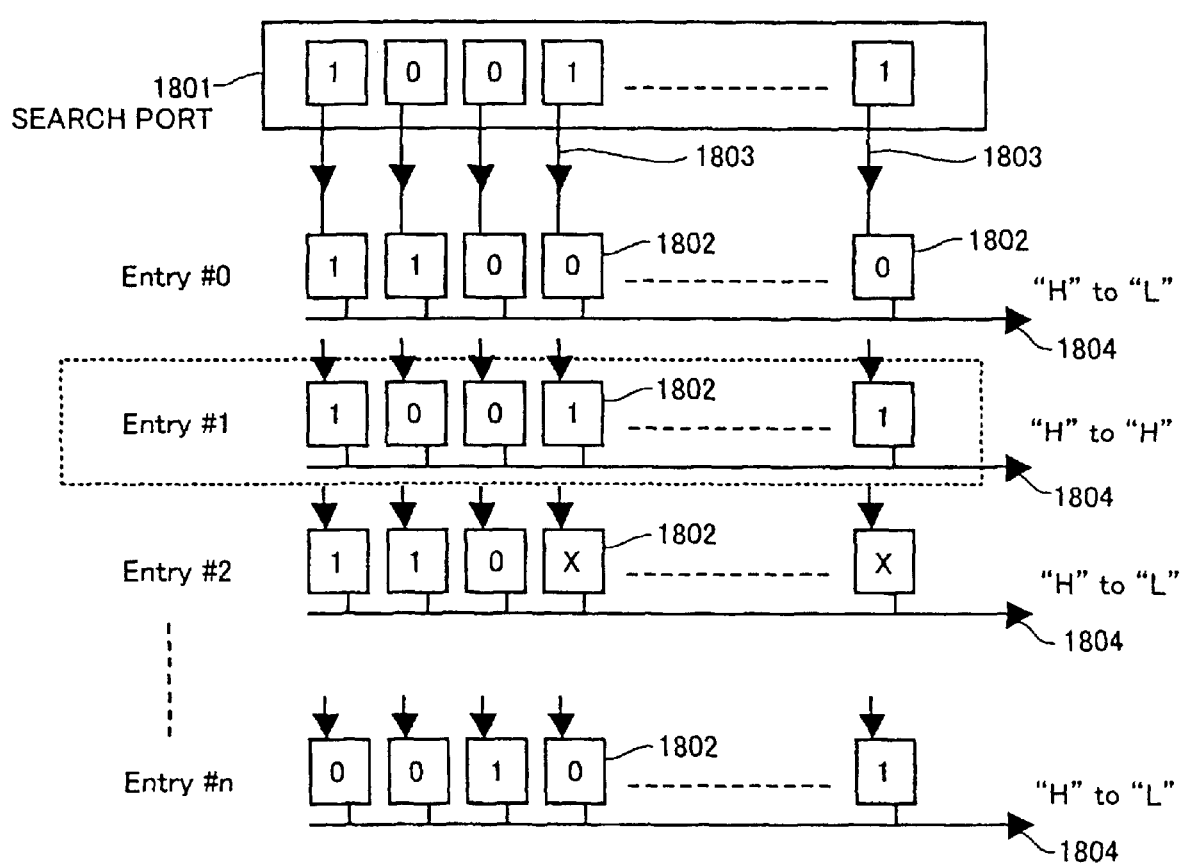
FIG. 17 is a concept diagram which shows a basic configuration and a search operation of the TCAM.

FIG. 14 is a block diagram which shows the concrete configuration of the system LSI that functions as the network address search apparatus shown in FIG. 13. As shown in FIG. 14, match line ML of a TCAM cell array 1501 is amplified by an amplifier 1502, and then is held by a pipeline register 1503. An output of the pipeline register 1503 is directly used as a word line WL of an action memory 1504 formed of a dynamic RAM (DRAM). By doing so, an action of a hit entry is automatically amplified by a sense amplifier 1505, and a desired output is obtained. In other words, it is possible to form the system LSI functioning as the network address search apparatus that is excellent in convenience to use from the viewpoint of an application.

According to one aspect of this invention, in the CAM cell array, the control circuits are provided correspondingly to the storage circuits and controlling the precharge circuits of the second memory cell array. Each of the control circuits prevents the precharge circuit to be controlled from precharging the match line connected to the precharge circuit to be controlled when the corresponding storage circuit stores the comparison result of the non-coincidence. Therefore, power consumption of the CAM cell array can be reduced.

According to another aspect of this invention, in the CAM cell array, the second memory cell array further includes the drivers driving the search line pairs of the second memory cell array, respectively. The search control circuit is connected to the match lines of the first memory cell array, and controls to prevent any of the drivers from driving the corresponding search line pair of the second memory cell array when the comparison result of the non-coincidence is provided. Therefore, power consumption of the CAM cell array can be reduced.

According to still another aspect of this invention, the TCAM cell that stores the ternary value of "1", "0", and "X" includes the two dynamic storage cells formed of the MOS transistors and the two capacitors, and the coincidence comparison circuit formed of the two MOS transistors. Therefore, the area occupied by the cell can be made small. Therefore, when an LSI is formed, TCAM cells of a large capacity can be mounted.

Moreover, the precharge level of the two search lines and the output line is a level lowered from the operation power supply level by a predetermined value. When a comparison result is non-coincidence, the potential level of the output line falls from the precharge level due to electric charge extraction. However, the potential level is kept at a predetermined potential level by the level maintenance unit before arriving at a ground potential level. Thus, the potential level does not become the ground potential level. Since the operation voltage range of the two search lines and the output line can be confined in a narrow range, therefore, the power consumption at the time of search operation can be reduced. Further, since the output line does not become the ground potential when the comparison result is non-coincidence, the operation threshold of a MOS transistor that indicates coincidence as a result of the comparison can be raised, and consequently false operation can be prevented.

Furthermore, the potential level of the output line can be kept from falling below a fixed level when the result of comparison is non-coincidence by the clamp circuit serving as the level maintenance unit.

Moreover, the TCAM cell includes the two dynamic storage cells formed of the MOS transistors and the capacitors, the coincidence comparison circuit formed of the two MOS transistors, and the current control circuit formed of the two MOS transistors. Therefore, the area occupied by the cell can be made small. Therefore, when an LSI is formed, TCAM cells of a large capacity can be mounted. In addition, the potential level of the output line can be kept from falling below a fixed level when the result of comparison is non-coincidence by the clamp circuit serving as the level maintenance unit.

Further, when each of M entries includes data having a N-bit length in the TCAM cell array formed of the dynamic TCAM cells each storing a ternary value of "1", "0" and "X", the pipeline control unit divides the TCAM cell array into subarrays by taking N/L bits as a unit, conducts in a subarray of a highest order operation of supplying search data on the two search lines, causing the coincidence comparison to be executed with respect to N/L bits, and detecting and holding output lines indicating coincidence among the output lines corresponding to the M entries. The pipeline control unit then conducts in a subarray of a next highest order operation of supplying search data on the two search lines, causing the coincidence comparison to be executed with respect to the detected output lines, and detecting and holding output lines indicating coincidence, and then conducts such an operation in order toward a low-order subarray. Thus, by using such a method of reducing the search targets hierarchically, the search operation is conducted. Therefore, the power consumption at the time of search operation can be reduced.

Moreover, output lines that become the search targets are precharged in each of the subarray of the next highest order and subsequent subarrays. Therefore, the power consumption at the time of search operation can be reduced.

Furthermore, in each of the subarray of the next highest order and subsequent subarrays, the search control unit controls so as to prevent search data from being supplied to the whole or a part of the two search lines that belong to an immediately preceding subarray of a higher order in accordance with a detection result of output lines of the subarray. Therefore, since the search targets are also reduced as to the search lines, the power consumption at the time of search operation can be further reduced.

Moreover, timing of the output line and the two search lines in each of the subarrays can be adjusted by using the adjustment unit.

Furthermore, the potential level of the output line can be kept from falling below a fixed level by the clamp circuit serving as the level maintenance unit when the result of comparison is non-coincidence.

Moreover, the TCAM cell includes the two dynamic storage cells formed of the MOS transistors and the capacitors, the coincidence comparison circuit formed of the two MOS transistors, and the current control circuit formed of the two MOS transistors. Therefore, the area occupied by the cell can be made small. Therefore, when an LSI is formed, TCAM cells of a large capacity can be mounted. Further, the potential level of the output line can be kept from falling below a fixed level by the current control circuit serving as the level maintenance unit when the result of comparison is non-coincidence.

Furthermore, between the two TCAM cell arrays formed of the dynamic TCAM cells each storing the ternary value of "1", "0", and "X", there are disposed the first control unit that controls a write operation, a read operation, and a refresh operation for the two TCAM cell arrays, and the second control unit that controls a search operation for the two TCAM cell arrays. And the encoders that encode search results controlled by the second control unit can be respectively disposed at output ends of the two TCAM cell arrays.

Moreover, the potential level of the output line can be kept from falling below a fixed level by the clamp circuit serving as the level maintenance unit when the result of comparison is non-coincidence.

Furthermore, the TCAM cell includes the two dynamic storage cells formed of the MOS transistors and the capacitors, the coincidence comparison circuit formed of the two MOS transistors, and the current control circuit formed of the two MOS transistors. Therefore, the area occupied by the cell can be made small. Therefore, when an LSI is formed, TCAM cells of a large capacity can be mounted. Further, the potential level of the output line can be kept from falling below a fixed level by the current control circuit serving as the level maintenance unit when the result of comparison is non-coincidence.

Moreover, the first control unit can control the two TCAM cell arrays as memory spaces that are independent of each other, and control the two TCAM cell arrays as one memory space as a whole.

Furthermore, the second control unit can execute the search operation on the two TCAM cell arrays simultaneously, and execute the search operation alternately on the two TCAM cell arrays by using a front edge and a tail edge of a system clock. Therefore, the search operation is executed at a high speed.

Moreover, the first control unit writes same data into the two TCAM cell arrays and then effects rewriting on the first TCAM cell array, and during that time the second control unit executes the search operation on the second TCAM cell array. In the rewriting period, the search operation can be executed in parallel without waiting for the end of rewriting.

Furthermore, the two encoders can execute one of or both of parallel-serial conversion and then outputting and of outputting input data in parallel.

Moreover, the TCAM cell array, the priority control unit, and the storage unit can be formed on the same semiconductor substrate. The TCAM cell array is formed of the dynamic TCAM cells each storing the ternary value of "1", "0" and "X", and the priority control unit outputs an entry corresponding to one selected output line when there are a plurality of output lines indicating coincidence as a result of the coincidence comparison in the TCAM cell array. The storage unit stores action data, receives an output of the priority control unit, and outputs a next action to be executed. From the viewpoint of an application, therefore, it is possible to form the system LSI functioning as the network address search apparatus that is excellent in convenience to use.

Furthermore, the TCAM cell array, the holding unit, and the storage unit can be formed on the same semiconductor substrate. The TCAM cell array is formed of the dynamic TCAM cells each storing the ternary value of "1", "0" and "X", and the holding unit converts a potential level of the output line indicating coincidence as a result of the coincidence comparison in the TCAM cell array to an operation level of the MOS transistor and holds the resultant operation level. The storage unit is formed of the dynamic storage cell using an output of the holding unit directly as a row selection signal and that stores action data. From the viewpoint of an application, therefore, it is possible to form the system LSI functioning as the network address search apparatus that is excellent in convenience to use.

Moreover, the potential level of the output line can be kept from falling below a fixed level by the clamp circuit serving as the level maintenance unit when the result of comparison is non-coincidence.

Furthermore, the TCAM cell includes the two dynamic storage cells formed of the MOS transistors and the capacitors, the coincidence comparison circuit formed of the two MOS transistors, and the current control circuit formed of the two MOS transistors. Therefore, the area occupied by the cell can be made small. When an LSI is formed, therefore, TCAM cells of a large capacity can be mounted. In addition, the potential level of the output line can be kept from falling below a fixed level by the current control circuit serving as the level maintenance unit when the result of comparison is non-coincidence.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A content addressable memory cell array comprising:
   a first memory cell array;
   a second memory cell array, each of the first and second memory cell arrays including
      a plurality of content addressable memory cells arranged in rows and columns,
      a plurality of search line pairs respectively connected to ones of the content addressable memory cells arranged in the columns,
      a plurality of match lines respectively connected to ones of the content addressable memory cells arranged in the rows, and
      a plurality of precharge circuits respectively connected to the match lines, each precharging the match line connected thereto,
   each of the content addressable memory cells including
      a coincidence comparison circuit comparing data stored in each of the content addressable memory cells with data on the search line pairs connected to each of the content addressable memory cells and providing a comparison result of coincidence or non-coincidence for the match line connected to each of the content addressable memory cells after being precharged;
   a plurality of storage circuits storing the comparison results on the match lines of the first memory cell array, respectively; and
   a plurality of control circuits provided correspondingly to the storage circuits and controlling the precharge circuits of the second memory cell array, each preventing the precharge circuit to be controlled from precharging the match line connected to the precharge circuit to be controlled when the corresponding storage circuit stores the comparison result of the non-coincidence.

2. The content addressable memory cell array according to claim 1, wherein
   each of the control circuits includes a logical circuit having a first input connected to an output of the storage circuit and a second input connected to a precharge line, and
   each of the precharge circuits includes a MOS transistor connected to one of the match lines of the second memory cell array and being on and off in accordance with an output signal of one of the control circuits.

3. The content addressable memory cell array according to claim 1, wherein
   the second memory cell array includes a plurality of amplifiers having inputs connected to the match lines of the second memory cell array and conducting amplification operations based on results of the comparison stored in the storage circuits, respectively.

4. The content addressable memory cell array according to claim 1, further comprising:
   a first number of first registers connected to the search line pairs of the first memory cell array; and
   a second number of second registers serially connected to the search line pairs of the first memory cell array, the second number being greater than the first number.

5. The content addressable memory cell array according to claim 1, wherein each of the content addressable memory cells of the first and second memory cell arrays includes a dynamic type memory cell holding a ternary value of "1", "0", and "X".

6. A content addressable memory cell array comprising:

a first memory cell array;

a second memory cell array, each of the first and second memory cell arrays including
- a plurality of content addressable memory cells arranged in rows and columns,
- a plurality of search line pairs respectively connected to ones of the content addressable memory cells arranged in the columns, and
- a plurality of match lines respectively connected to ones of the content addressable memory cells arranged in the row, each of the content addressable memory cells including
- a coincidence comparison circuit comparing data stored in each of the content addressable memory cells with data on the search line pairs connected to each of the content addressable memory cells and providing a comparison result of coincidence or non-coincidence for the match line connected to each of the content addressable memory cells, the second memory cell array further including
- a plurality of drivers driving the search line pairs of the second memory cell array, respectively; and a search control circuit connected to the match lines of the first memory cell array, and controlling to prevent any of the drivers from driving the corresponding search line pair of the second memory cell array when the comparison result of the non-coincidence is provided.

7. The content addressable memory cell array according to claim 6, wherein each of the content addressable memory cells of the first and second memory cell arrays includes a dynamic type memory cell holding a ternary value of "1", "0", and "X".

* * * * *